(12) United States Patent
Cortelyou et al.

(10) Patent No.: US 10,335,695 B2
(45) Date of Patent: Jul. 2, 2019

(54) SYSTEMS AND METHODS FOR INCORPORATING PNEUMATIC ROBOTIC SYSTEMS INTO STRUCTURES

(71) Applicant: Universal City Studios LLC, Universal City, CA (US)

(72) Inventors: Robert Cortelyou, Orlando, FL (US); Ross Osterman, Orlando, FL (US); Justin Schwartz, Orlando, FL (US); Amanda Zielkowski, Orlando, FL (US); Caitlin A. Correll, Orlando, FL (US); Darrin Hughes, Orlando, FL (US); Anisha Vyas, Orlando, FL (US)

(73) Assignee: Universal City Studios LLC, Universal City, CA (US)

( * ) Notice: Subject to any disclaimer, the term of this patent is extended or adjusted under 35 U.S.C. 154(b) by 0 days.

(21) Appl. No.: 15/703,728

(22) Filed: Sep. 13, 2017

(65) Prior Publication Data

US 2018/0071641 A1  Mar. 15, 2018

Related U.S. Application Data

(60) Provisional application No. 62/393,928, filed on Sep. 13, 2016.

(51) Int. Cl.
| | |
|---|---|
| A63G 31/12 | (2006.01) |
| A63G 21/18 | (2006.01) |
| A63G 21/14 | (2006.01) |
| A63G 31/00 | (2006.01) |
| A63B 71/06 | (2006.01) |

(Continued)

(52) U.S. Cl.
CPC .......... *A63G 31/12* (2013.01); *A63B 71/0622* (2013.01); *A63G 3/00* (2013.01); *A63G 7/00* (2013.01); *A63G 21/14* (2013.01); *A63G 21/18* (2013.01); *A63G 27/00* (2013.01); *A63G 31/007* (2013.01); *A63G 31/16* (2013.01);

(Continued)

(58) Field of Classification Search
CPC ........ A63G 31/00; A63G 31/12; A63G 31/16; A63H 5/00; A63J 11/00
USPC ................ 472/59, 60, 62, 134; 446/220–226
See application file for complete search history.

(56) References Cited

U.S. PATENT DOCUMENTS

| | | |
|---|---|---|
| 3,830,161 A | 8/1974 | Bacon |
| 4,423,864 A | 1/1984 | Wiik |

(Continued)

FOREIGN PATENT DOCUMENTS

| | | |
|---|---|---|
| CN | 2226963 | 5/1996 |
| DE | 102004054867 A1 | 5/2006 |

(Continued)

OTHER PUBLICATIONS

PCT/US2012/031278; International Search Report and the Written Opinion, dated Jun. 29, 2012, 12 pages.

*Primary Examiner* — Kien T Nguyen
(74) *Attorney, Agent, or Firm* — Fletcher Yoder, P.C.

(57) ABSTRACT

A system may include a virtual reality system configured to present one or more virtual objects via an electronic display. The system may also include one or more inflatable objects that correspond to the one or more virtual objects, such that the one or more inflatable objects matches one or more shapes of the one or more virtual objects. The system may also include a processor configured to cause at least one of the one or more inflatable objects to inflate based on feedback from the virtual reality system.

7 Claims, 29 Drawing Sheets

(51) Int. Cl.
*G09B 9/06* (2006.01)
*A63G 31/16* (2006.01)
*A63G 3/00* (2006.01)
*A63G 7/00* (2006.01)
*A63G 27/00* (2006.01)
*A63H 5/00* (2006.01)
*G06F 17/50* (2006.01)

(52) U.S. Cl.
CPC .......... *G09B 9/063* (2013.01); *A63B 2208/12* (2013.01); *G06F 17/5009* (2013.01)

(56) References Cited

U.S. PATENT DOCUMENTS

| | | | |
|---|---|---|---|
| 5,219,315 A | 6/1993 | Fuller et al. | |
| 5,230,662 A | 7/1993 | Langford | |
| 5,704,294 A | 1/1998 | Van Winkle et al. | |
| 5,735,748 A | 4/1998 | Meyers et al. | |
| 5,906,373 A * | 5/1999 | Sanders | A63B 67/00 273/349 |
| 6,019,547 A | 2/2000 | Hill | |
| 6,508,717 B2 | 1/2003 | Katayama | |
| 6,675,538 B2 * | 1/2004 | Candio | A63J 11/00 273/110 |
| 7,354,351 B2 | 4/2008 | Edwards | |
| 7,572,166 B2 | 8/2009 | Blum et al. | |
| 7,847,426 B1 | 12/2010 | Griffith et al. | |
| 8,640,386 B1 | 2/2014 | Griffith et al. | |
| 2002/0090565 A1 | 7/2002 | Griffith et al. | |
| 2003/0052425 A1 | 3/2003 | Griffith | |
| 2004/0033679 A1 | 2/2004 | Jacobson et al. | |
| 2005/0231207 A1 | 10/2005 | Goldwater et al. | |
| 2008/0150378 A1 | 6/2008 | Heinrich et al. | |
| 2009/0033098 A1 | 2/2009 | Griffith et al. | |
| 2009/0072092 A1 | 3/2009 | Griffith et al. | |
| 2009/0289148 A1 | 11/2009 | Griffith et al. | |
| 2010/0120323 A1 * | 5/2010 | Boretskin | A63G 31/12 446/220 |
| 2012/0129617 A1 | 5/2012 | Olive et al. | |
| 2012/0158369 A1 | 6/2012 | Bachrach et al. | |
| 2013/0191083 A1 | 7/2013 | Bachrach et al. | |
| 2013/0297058 A1 | 11/2013 | Griffith et al. | |
| 2013/0299503 A1 | 11/2013 | Griffith et al. | |
| 2014/0081603 A1 | 3/2014 | Griffith et al. | |
| 2014/0083230 A1 | 3/2014 | Calisti et al. | |
| 2014/0109560 A1 | 4/2014 | Illievski et al. | |
| 2014/0194174 A1 | 7/2014 | Bachrach et al. | |
| 2014/0253549 A1 | 9/2014 | Bachrach et al. | |
| 2014/0253550 A1 | 9/2014 | Bachrach et al. | |
| 2014/0257547 A1 | 9/2014 | Bachrach et al. | |
| 2014/0257548 A1 | 9/2014 | Bachrach | |
| 2014/0318118 A1 | 10/2014 | Mazzeo et al. | |
| 2015/0111655 A1 * | 4/2015 | Coleman | A63G 31/12 472/134 |
| 2015/0217459 A1 | 8/2015 | Morin et al. | |
| 2015/0257968 A1 | 9/2015 | Vause et al. | |
| 2015/0266186 A1 | 9/2015 | Mosadegh et al. | |
| 2015/0285238 A1 | 10/2015 | Lynn et al. | |
| 2015/0337873 A1 | 11/2015 | Yang et al. | |
| 2015/0352813 A1 | 12/2015 | Galloway et al. | |
| 2015/0354547 A1 | 12/2015 | Ting et al. | |
| 2016/0052131 A1 | 2/2016 | Lessing et al. | |
| 2016/0075036 A1 | 3/2016 | Lessing et al. | |
| 2016/0114482 A1 | 4/2016 | Lessing et al. | |
| 2016/0135799 A1 | 5/2016 | Lessing et al. | |
| 2016/0167227 A1 | 6/2016 | Wellman et al. | |
| 2016/0200024 A1 | 7/2016 | Kim et al. | |
| 2016/0261224 A1 | 9/2016 | Madrone et al. | |
| 2016/0278948 A1 | 9/2016 | Piercy et al. | |
| 2016/0279803 A1 | 9/2016 | Lessing et al. | |
| 2016/0281748 A1 | 9/2016 | Lynn et al. | |
| 2016/0318609 A1 | 11/2016 | Lynn et al. | |
| 2016/0340814 A1 | 11/2016 | Ridley et al. | |
| 2016/0341224 A1 | 11/2016 | Lynn et al. | |
| 2016/0361821 A1 | 12/2016 | Lessing et al. | |
| 2016/0363265 A1 | 12/2016 | Griffith et al. | |
| 2016/0375590 A1 | 12/2016 | Lessing et al. | |
| 2017/0028566 A1 | 2/2017 | Knopf et al. | |
| 2017/0029592 A1 | 2/2017 | Shepherd et al. | |
| 2017/0036355 A1 | 2/2017 | Lessing et al. | |

FOREIGN PATENT DOCUMENTS

| | | |
|---|---|---|
| NL | 9301619 | 10/1994 |
| WO | 2001032405 A1 | 5/2001 |
| WO | 2015154078 A1 | 10/2015 |
| WO | 2016187302 A1 | 11/2016 |

* cited by examiner

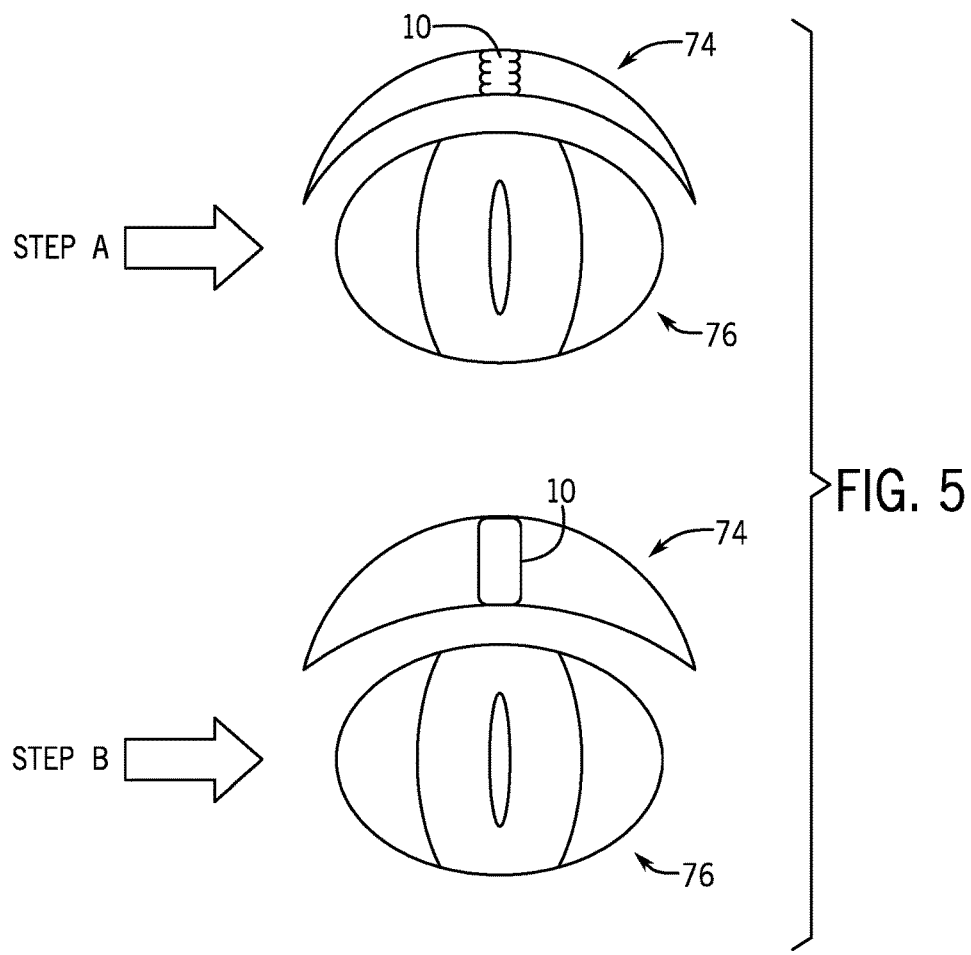
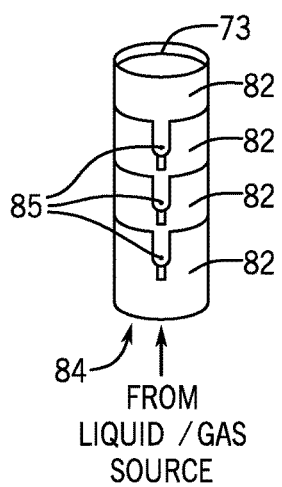
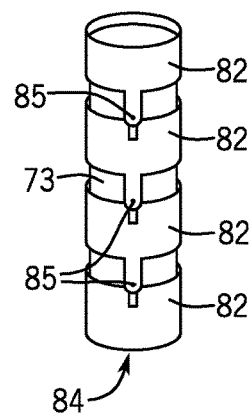

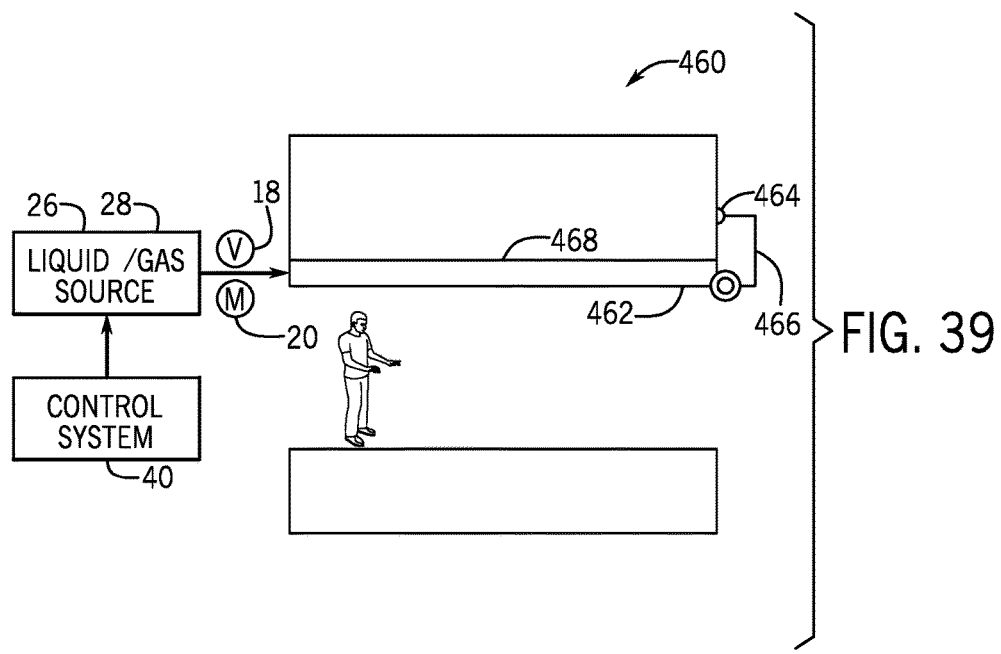
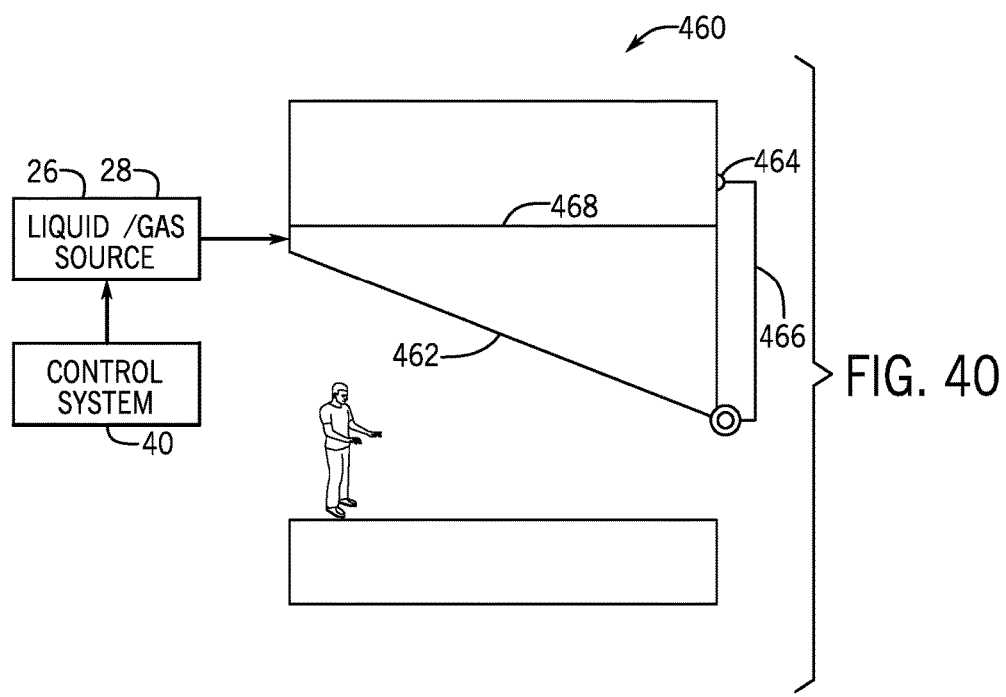

SYSTEMS AND METHODS FOR INCORPORATING PNEUMATIC ROBOTIC SYSTEMS INTO STRUCTURES

CROSS-REFERENCE TO RELATED APPLICATION

This application claims priority to and the benefit of U.S. Provisional Application No. 62/393,928, entitled "PNEUMATIC ROBOTIC SYSTEMS," filed Sep. 13, 2016, which is hereby incorporated by reference in its entirety for all purposes.

BACKGROUND

The present disclosure relates generally to the field of amusement parks. More specifically, embodiments of the present disclosure relate to systems and methods for providing and enhancing amusement park experiences related to pneumatic robotic systems.

Various amusement rides and exhibits have been created to provide guests with unique interactive, motion, and visual experiences. In various rides and exhibits, guest experiences may be enhanced by employing certain interactive robotic features within the rides and exhibits. However, it is now recognized that various mechanical devices that actuate these interactive components may often appear to move in a linear or excessively mechanical manner that leaves the user with the impression of interacting with a robot, as opposed to a more life-like object.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a system may include a virtual reality system configured to present one or more virtual objects via an electronic display. The system may also include one or more inflatable objects that correspond to the one or more virtual objects, such that the one or more inflatable objects matches one or more shapes of the one or more virtual objects. The system may also include a processor configured to cause at least one of the one or more inflatable objects to inflate based on feedback from the virtual reality system.

In another embodiment, an inflatable assembly may include a first zone and a second zone separated from the first zone by a distance. The inflatable assembly may also include an inflatable object and a cavity configured to store the inflatable object, such that the inflatable object forms a shape between the first zone and the second zone in an inflated configuration. The inflatable assembly may also include one or more valves, such that the one or more valves are controllable and direct fluid flow into the inflatable object such that the inflatable object facilitates transport between the first zone and the second zone in the inflated configuration. The inflatable assembly may also include a processor that adjusts one or more positions of the one or more valves to control the fluid flow into inflatable object.

In yet another embodiment, a system may include an inflatable object that may be submerged in a liquid environment, such that the liquid environment includes a first fluid. The system may also include one or more valves that direct a second fluid into the inflatable object and a processor. The processor may adjust one or more positions of the one or more valves to cause the second fluid to be directed into the inflatable object in response to a signal, such that the inflatable object may be partially exposed above the liquid environment when the second fluid is directed into the inflatable object. The inflatable object may provide at least a partial pathway between a first zone and a second zone.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

DRAWINGS

These and other features, aspects, and advantages of the present disclosure will become better understood when the following detailed description is read with reference to the accompanying drawings in which like characters represent like parts throughout the drawings, wherein:

FIG. 5 illustrates an example of a facial feature in the inflatable object of FIG. 4, in accordance with embodiments described herein;

FIG. 7 illustrates an example inflatable structure used to adjust the facial feature in the inflatable object of FIG. 4 prior to being inflated, in accordance with embodiments described herein;

FIG. 8 illustrates an example inflatable structure used to adjust the facial feature in the inflatable object of FIG. 4 after being inflated, in accordance with embodiments described herein;

FIG. 39 illustrates a diagram of a room environment with a ceiling feature using the inflatable pneumatic system, in accordance with embodiments described herein;

FIG. 40 illustrates a diagram of a room environment with a ceiling feature using the inflatable pneumatic system, in accordance with embodiments described herein;

DETAILED DESCRIPTION

One or more specific embodiments will be described below. In an effort to provide a concise description of these embodiments, not all features of an actual implementation are described in the specification. It should be appreciated that, in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

It is now recognized that various mechanical devices used in amusement park environments may lack interactive components that may physically contact guests. Moreover, these mechanical devices often appear to move in a linear, or more mechanical, nature that leaves the user with the impression of interacting with a robot, as opposed to a more life-like object. With this in mind, present embodiments are directed to pneumatic robotic technology that may be employed to create mechanical devices that move in more fluid and life-like manners that enhance various interactive and visual guest experiences.

Pneumatic robotic technology, in accordance with present embodiments, may provide the ability for humans to interact with machines in a safe and interactive fashion since they achieve their shapes and movements by directing gas and/or liquid through a collapsible or inflatable material (e.g., housing). As used herein, pneumatic robotic technology (e.g., pneumatic robots) may include balloon-like or inflatable objects that receive gas and/or liquid to form a discernable shape. In addition, pneumatic robotic technology may include actuators or gas directing mechanisms (e.g., gas-operated actuators) within the inflatable objects that may adjust to cause the inflatable objects to move in certain directions or patterns. In this way, pneumatic robotic technology may be used to form various shapes, bodies, structures, and other formations that may have traditionally been difficult to create using metallic-type materials. With this in mind, there are numerous ways to incorporate pneumatic robotic technology into certain environments to enhance a user experience when interacting with exhibits that employ the pneumatic robotic technology, when observing visual effects provided via the pneumatic robotic technology, when partaking in rides that use the pneumatic robotic technology, and the like. Additional details with regard to incorporating pneumatic robotic technology into various inflatable objects will be discussed below with reference to FIGS. 1-51.

Inflatable Objects with Controlled Motion

Figure 1:
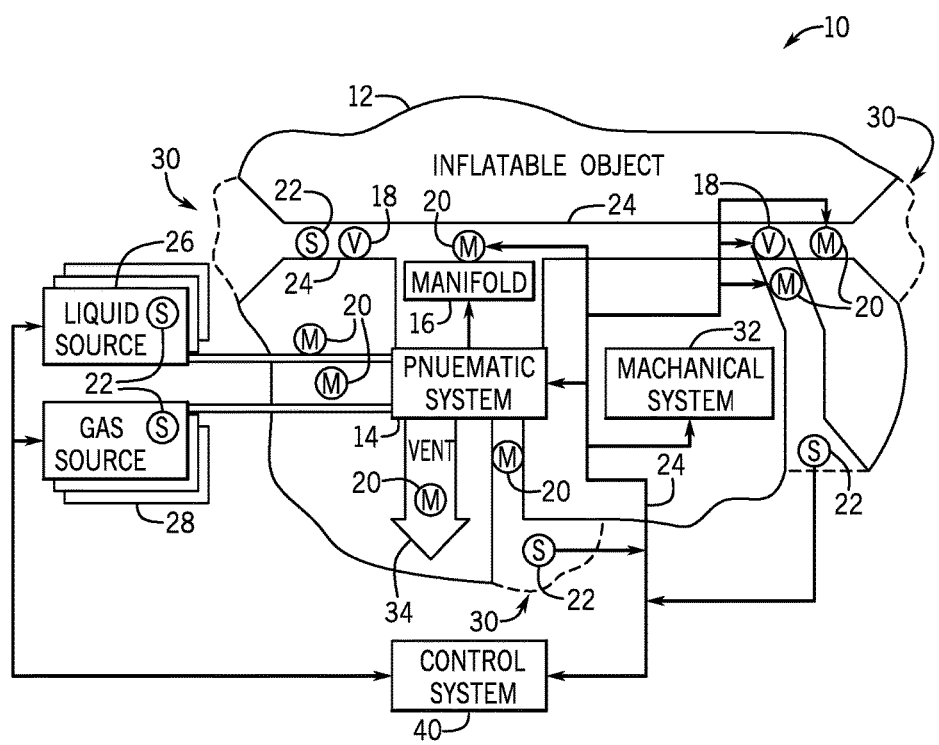
FIG. 1 illustrates a block diagram of an inflatable pneumatic system, in accordance with embodiments described herein.

By way of introduction, FIG. 1 illustrates a block diagram of components that may make up an inflatable pneumatic system 10, in accordance with present embodiments, which may be used to control motion and/or the appearance of an inflatable object 12. The inflatable object 12 may include any suitable material that may be shaped or molded to form a discernable figure or object when inflated with a fluid (e.g., gas or liquid). To provide a more life-like feel to the animated figures, a spray-on silicon compound may be applied to the material. As such, the inflatable object 12 may have a finish or texture applied to the inflatable material that feels like a certain skin texture (e.g., reptile, scaly, human, fur). By way of example, the inflatable object 12 may include parade-style balloons, replica figures, structures, restraints, costumes, and other objects that will be discussed in detail below.

As shown in FIG. 1, the inflatable pneumatic system 10 may include a pneumatic system 14 that may control the operation of various components disposed within the inflatable object 12. For example, the pneumatic system 14 may be communicatively coupled to one or more manifolds 16, one or more valves 18, one or more meters 20, one or more sensors 22, and the like. The manifold 16 may include a chamber or intersection between a number of pipes 24, conduit, or the like. The manifold 16 may also include mechanical components such as valves 18, mechanical members, and other suitable items that may direct liquid or gas flow to one or more of a plurality of pipes 24.

To determine the present conditions within the pipes 24 or a portion of the pipes 24, the pneumatic system 14 may receive data from the meters 20 or the sensors 22. The meter 20 may include any suitable device that may measure various flow characteristics such as the flow of gas, flow of liquid, the rate of flow for gas or liquid, and the like. In addition, the sensors 22 may provide data regarding different areas within the inflatable object 12, the pipes 24, and the like. As such, the sensors 22 may include devices that measure temperature, pressure, volume, light intensity, and the like. In addition, the sensors 22 may include devices capable of detecting electronic, radio, infrared, optical, and other signals that may provide an indication to the pneumatic system 14 of certain conditions of the environment present within or outside the inflatable object 12. For instance, the sensor 22 may detect whether a person or object is within a certain proximity to the inflatable object 12 (e.g., presence of human) and send data related to the detected person or object to the pneumatic system 14. The pneumatic system 14 may, in turn, control the gas or liquid flow within the inflatable object 12 based on the received data.

The pneumatic system 14 may receive a liquid or a gas from a liquid source 26 or a gas source 28, respectively. The liquid source 26 may include one or more containers of different types of liquid having different densities. The gas source 28 may also include one or more tanks that have different types of gases (e.g., helium, air) having different densities. In certain embodiments, the pneumatic system 14 may control motion within the inflatable object 12 by changing the gas provided to a certain portion 30 (e.g., chamber) of the inflatable object 12. For example, if the pneumatic system 14 is attempting to lift the portion 30, the pneumatic system 14 may change the air being supplied to the portion 30 from ambient air to helium.

In addition to controlling the type of liquid or gas provided to different portions 30, a mechanical system 32 may mechanically move the portion 30. That is, the mechanical system 32 may include a controller or control system that receives a command from the pneumatic system 14 to move mechanical components (e.g., actuators) that may be bound to the portion 30. For example, the rigid rods may be placed around the exterior of the portion 30 and may be moved using a motor or other suitable device. The mechanical system 32 may control the operation of the motor to cause the rods to move in a particular manner. In some embodiments, the pneumatic system 14 may control the operation of the mechanical system 32 in conjunction with the liquid or gas provided to the portion 30 to create different types of motion.

The portion 30 of the inflatable object 12 may be composed of a flexible material such as rubber or the like that may form a certain shape when inflated. By way of example, the portion 30 may include two-dimensional sheets of the flexible material that may be bound together to form a three-dimensional object, such as a hand or arm and hand. The arm may include an exoskeleton structure, such as a collection of rods, that may include a number of motors or other suitable device that control the motion of the exoskeleton structure. To lift the arm, as discussed above, the pneumatic system 14 may inflate the portion 30 with helium gas via the gas source 28. The pneumatic system 14 may then use the mechanical system 32 to control other motions of the arm while the portion 30 is inflated. In addition to forming the inflatable object 12 with materials discussed above, in some embodiments, the inflatable object 12 or portions 30 of the inflatable object 12 may be composed of a flexible material that forms a molded cavity. As the material is inflated, the inflatable object 12 may take the shape of the cavity.

In some embodiments, the liquid or gas pumped into the inflatable object 12 may be vented via one or more vents 34. The vents 34 may allow the liquid or gas to exit the inflatable object and be replaced by new liquid or gas from the liquid source 26 or the gas source 28. It should be noted that the vent 34 may also recirculate fluid in the inflatable object 12 to keep the inflatable object 12 inflated without being coupled to a liquid source 26 or a gas source 28. Recirculating air in the inflatable object 12 may involve using fans or pumps to cause the fluid to continuously move throughout the inflatable object 12 via the pipes 24 (e.g., to generate a motion). In one example, the pipe 24, conduit, or chamber may be embedded within the interior of the inflatable object 12 to form an outline of the inflatable object 12. As such, when the fluid recirculates through the inflatable object 12, the inflatable object 12 may form a discernable shape without being coupled to the liquid source 26 or the gas source 28.

Figure 2:
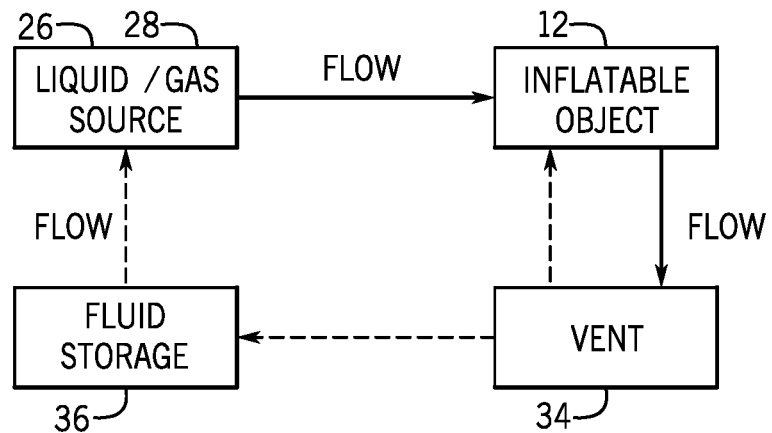
FIG. 2 illustrates a block diagram of a closed-loop air flow within the inflatable pneumatic system of FIG. 1, in accordance with embodiments described herein.

With the foregoing in mind, FIG. 2 illustrates an example flow diagram of fluid flow in the inflatable pneumatic system 10. As shown in FIG. 2, the liquid source 26 and/or the gas source 28 may provide liquid or gas to the inflatable object 12. The flow of fluid may then exit the inflatable object 12 via the vent 34. The vent 34 may redirect the fluid flow back to the inflatable object 12 or to a fluid storage component 36. The fluid storage component 36 may serve as the liquid source 26 or the gas source 28 or may provide the fluid to the liquid source 26 or the gas source 28.

Figure 3:
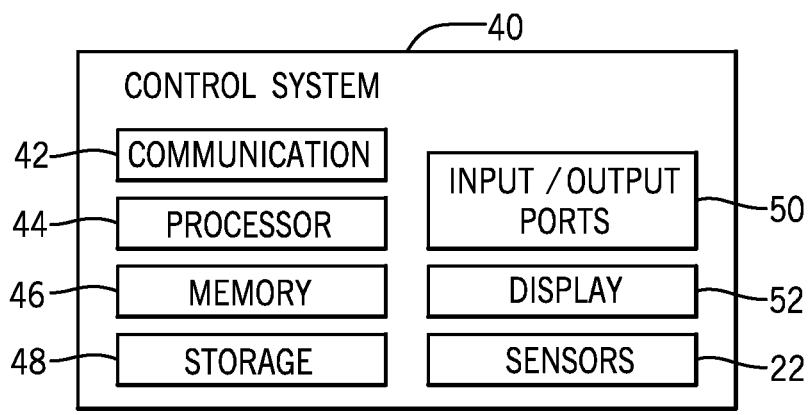
FIG. 3 illustrates a block diagram of a control system that may be part of the inflatable pneumatic system of FIG. 1, in accordance with embodiments described herein.

The pneumatic system 14 and the mechanical system 32 may, in some embodiments, be controlled or operated via a control system 40. The control system 40 may include any suitable computing system such as a laptop, a tablet computing device, a desktop computing device, or the like. To control the operations of the pneumatic system 14, the mechanical system 32, the manifold 16, the valves 18, and the other components discussed above, the control system 40 may include certain components to facilitate these actions. FIG. 3 is a block diagram of example components within the control system 40. For example, the control system 40 may include a communication component 42, a processor 44, a memory 46, a storage 48, input/output (I/O) ports 50, a display 52, and the like. The communication component 42 may be a wireless or wired communication component that may facilitate communication between the control system 40, the pneumatic system 14, the mechanical system 32, the manifold 16, the valves 18, the sensors 22, the liquid source 26, the gas source 28, and the like.

The processor 44 may be any suitable type of computer processor or microprocessor capable of executing computer-executable code. The processor 44 may also include multiple processors that may perform the operations described below.

The memory 46 and the storage 48 may be any suitable articles of manufacture that can serve as media to store processor-executable code, data, or the like. These articles of manufacture may represent computer-readable media (e.g., any suitable form of memory or storage) that may store the processor-executable code used by the processor 44 to perform the presently disclosed techniques. The memory 46 and the storage 48 may also be used to store the data, various other software applications, and the like. The memory 46 and the storage 48 may represent non-transitory computer-readable media (e.g., any suitable form of memory or storage) that may store the processor-executable code used by the processor 44 to perform various techniques described herein. It should be noted that non-transitory merely indicates that the media is tangible and not a signal.

The I/O ports 50 may be interfaces that may couple to other peripheral components such as input devices (e.g., keyboard, mouse), sensors, input/output (I/O) modules, and the like. The display 52 may operate to depict visualizations associated with software or executable code being processed by the processor 44. In one embodiment, the display 52 may be a touch display capable of receiving inputs from a user of the control system 40. The display 52 may be any suitable type of display, such as a liquid crystal display (LCD), plasma display, or an organic light emitting diode (OLED) display, for example.

It should be noted that the components described above with regard to the control system 40 are exemplary components, and the control system 40 may include additional or fewer components as shown. Additionally, it should be noted that the pneumatic system 14 and the mechanical system 32 may also include similar components as described as part of the control system 40.

Figure 4:
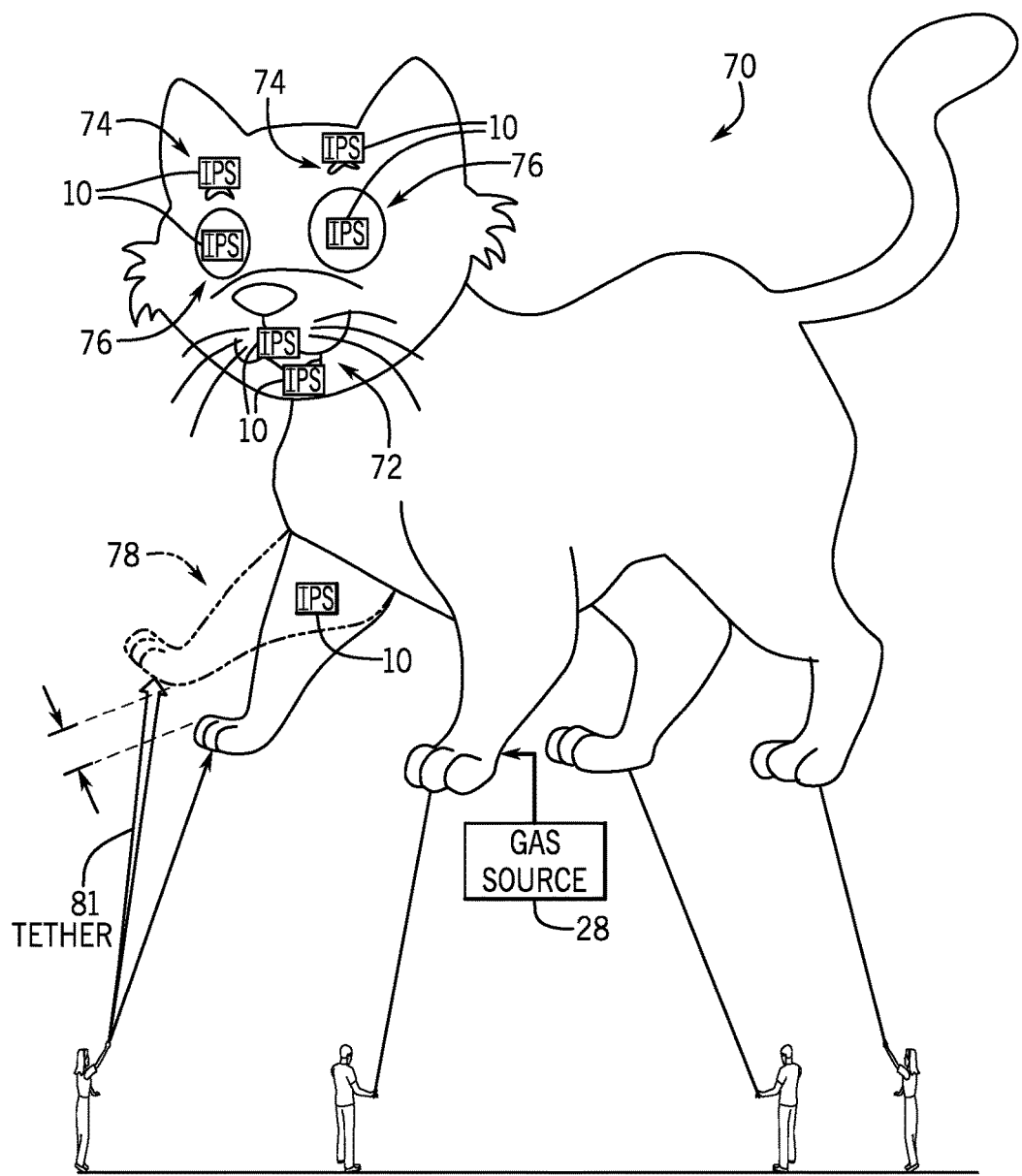
FIG. 4 illustrates an example of a parade-style inflatable object with one or more inflatable pneumatic systems incorporated therein, in accordance with embodiments described herein.

With the foregoing in mind, FIG. 4 illustrates an example large-scale balloon 70 for use in parades and other similar amusement environments that may incorporate the inflatable pneumatic system 10 described above to control movements of the balloon or portions of the balloon. The large-scale balloon 70 may include any suitable inflatable object 12 that may be larger than approximately 6 feet. In certain embodiments, the large-scale balloon 70 may be attached to ropes or the like, such that people, vehicles, and other objects may hold the large-scale balloon 70. In certain embodiments, the large-scale balloon 70 may employ inflatable pneumatic systems (IPS) 10 to cause different parts of the large-scale balloon 70 to move in different directions. For example, the IPS 10 may depict facial expressions for the large-scale balloon 70, move extremities of the large-scale balloon 70, and the like. By way of example, when making facial expressions, the large-scale balloon 70 may have a separate enclosed (e.g., cylindrical) fabric or material that is placed around a portion 72 of the large-scale balloon 70 that corresponds to the respective character's mouth. As shown in FIG. 4, lip portions 72 of the large-scale balloon 70 may include the IPS 10, which may control certain motions of the lip portions 72, the size of the lip portions 72, and the like.

The large-scale balloon 70 may be inflated with a gas that may cause the large-scale balloon 70 to lift off of the ground. To inflate the large-scale balloon 70, the gas source 28 may be coupled to an aperture of the large-scale balloon 70 and filled with the gas. In the same manner, various portions of the large-scale balloon 70 may be inflated using the gas source 28, such that after the material is inflated, the inflated material forms an oral expression, such as a smile, a frown, or the like. Depending on the amount of inflation, different expressions may be provided.

Figure 6:
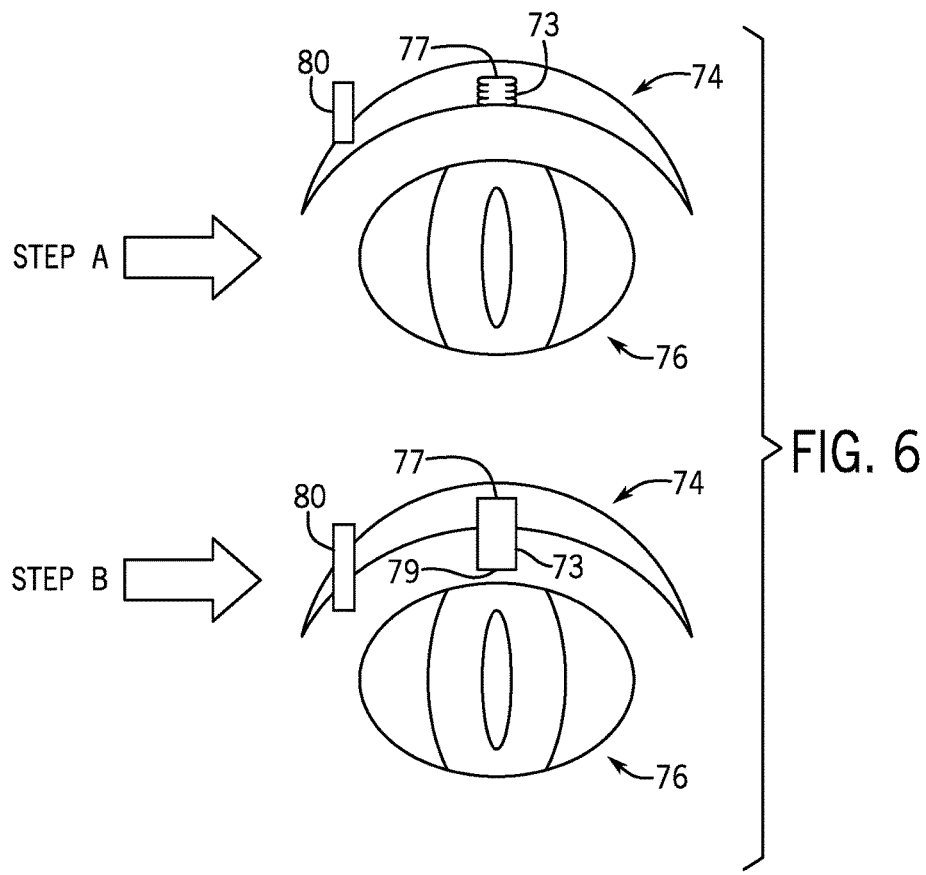
FIG. 6 illustrates an example of a facial feature in the inflatable object of FIG. 4, in accordance with embodiments described herein.

In another example, the IPS 10 or an adjustment inflatable 73 of the IPS 10 may be positioned in eyebrow portions 74 and/or eyeball portions 76 of the large-scale balloon 70. By way of example, FIGS. 5 and 6 illustrate embodiments in which the eyebrow portion 74 may move. As shown in FIG. 5, the eyebrow portion 74 may include the adjustment inflatable 73 (a portion of the inflatable pneumatic system 10), which may control the size and/or position of the eyebrow portion 74. For example, the inflatable pneumatic system 10 may deflate the adjustment inflatable 73, as shown in step A of FIG. 5, and inflate the adjustment inflatable 73 (example of the inflatable object 12), as shown in step B of FIG. 5, to control the size of the eyebrow portion 74.

In another embodiment, as illustrated in FIG. 6, part of the eyebrow portion 74 may be coupled to a free end 77 of the adjustment inflatable 73 such that inflation and deflation of the adjustment inflatable 73 causes the eyebrow portion 74 (which may be inflated and remain at a fixed inflation level) to raise or lower with respect to a portion 79 of the adjustment inflatable 73 that is connected to the main body of the large-scale balloon 70. Thus, the eyebrow portion 74 may raise (Step B of FIG. 6) and lower (Step A of FIG. 6) with respect to the eyeball portion 76 to change expressions. This may be facilitated by including a groove or channel that maintains the adjustment inflatable 73 within a fixed area and provides a path for expansion and contraction.

In the illustrated embodiment, the adjustment inflatable 73 includes an inflatable cylinder and it may be positioned in a correspondingly shaped groove that maintains an alignment of the adjustment inflatable 73 with a direction of motion for the eyebrow portion 74 as the cylinder is filled with fluid and expands along the groove. The eyebrow portion 74 may be connected to the large-scale balloon 70 with elastic connectors (e.g., elastic bands), elongate strands (e.g., ribbons or strings), guide/groove mechanisms 80, or the like that allow for a range of motion but also keep the eyebrow portion 74 within a certain area. In some embodiments, the IPS 10 may include multiple adjustment inflatables 73 (such as the cylinder described above) that can be inflated and/or deflated in various combinations to provide different expressions (e.g., by causing one end of the eyebrow portion 74 to go up and another to remain steady or go down).

By way of example, FIGS. 7 and 8 illustrate how the eyebrow portion 74 of FIGS. 5 and 6 may move. As shown in FIG. 7, the IPS 10 may include a number of exoskeleton sections 82 surrounding the adjustment inflatable 73. Upper exoskeleton sections 82 may rest on lower sections 82 when the adjustment inflatable 73 disposed inside is deflated. The exoskeleton sections 82 may operate to maintain a certain shape, provide guidance, provide structural support, and the like. The liquid source 26 or the gas source 28 may be fluidly coupled to an end of the adjustment inflatable 73. As the adjustment inflatable 73 expands, the sections 82 may be forced to extend away from each other but maintain contact via couplings 85 (e.g., guide and groove connections) between each adjacent section 82.

It should be noted that the structures described above and related to changing expressions of the large-scale balloon 70 are merely provided as examples, and other suitable embodiments for adjustment using inflatable objects may also be employed. It should also be noted that, in some embodiments, components (e.g., meters, valves, sensors) described as part of the IPS 10 in FIG. 1 may also be incorporated into any of the inflatable systems described herein to control the flow of the fluid and associated mechanical components that may be integrated into the IPS 10.

Figures 9, 10:
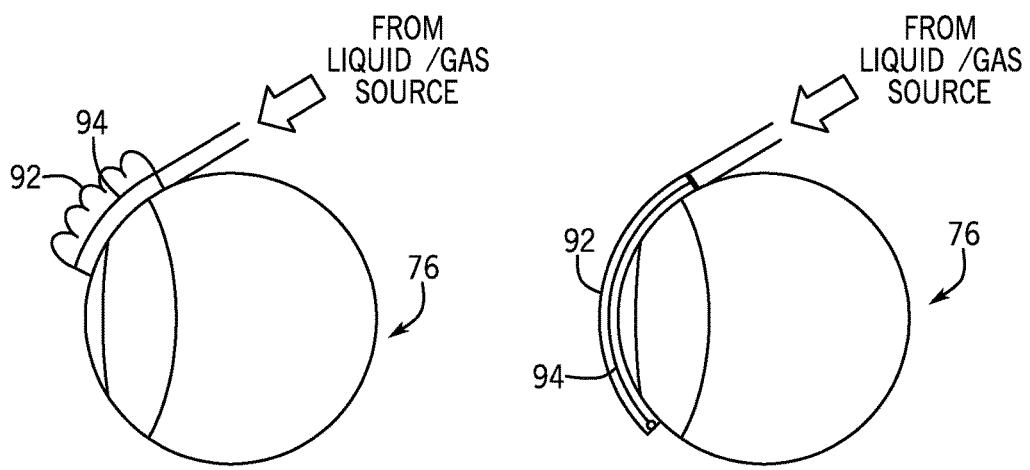
FIG. 9 illustrates an example inflatable structure used to adjust an eyelid feature in the inflatable object of FIG. 4 prior to being inflated, in accordance with embodiments described herein.
FIG. 10 illustrates an example inflatable structure used to adjust an eyelid feature in the inflatable object of FIG. 4 after being inflated, in accordance with embodiments described herein.

With the foregoing in mind, FIGS. 9 and 10 illustrate an example system for closing an eyelid portion 92 of the eyeball portion 76. As shown in FIG. 9, the eyelid portion 92 may be positioned above the eyeball portion 76. The eyelid portion 92 may be made up of the inflatable material and may be retracted from covering the eyeball portion 76. In one embodiment, a stretchable band 94 may pull the eyelid portion 92, such that the eyelid portion 92 is retracted when the stretchable band 94 has no tension. After a fluid is provided to the eyelid portion 92 via the liquid source 26 or the gas source 28, the stretchable band 94 may expand or stretch and the eyelid portion 92 may inflate to cover the eyeball portion 76.

In addition, fluid may be directed in a certain direction within a portion of the large-scale balloon 70 that corresponds to an extremity (e.g., arm, leg) of a represented character. In one example, fluid may be distributed in alternate directions to cause the portion of the large-scale balloon 70 to continuously move in opposing directions to simulate, for example, a waving or kicking motion. A variety of gas deflection mechanisms may be placed within the balloon or within the material used to create the structure or form of the pneumatic robot to cause the balloon to move in a controlled manner. As a result, the user experience in observing the large-scale balloon 70 is enhanced. In some embodiments, the movements of the balloon may be controlled based on feedback from the user, as detected via the sensors 22, to further enhance the user experience.

With this in mind and referring back to FIG. 4, the inflatable pneumatic system 10 may also be employed to control a motion of an extremity portion 78 of the large-scale balloon 70. In certain embodiments, a tether line 81 may be coupled to the large-scale balloon 70 via the extremity portion 78. The tether line 81 may provide fluids via the liquid source 26, the gas source 28, and the like. As the fluid is provided into the extremity portion 78, the movement of the extremity portion 78 may be controlled by adjusting the type of fluid (e.g., density) provided to the extremity portion 78, controlling mechanical components within the extremity portion 78, and the like.

Figure 11:
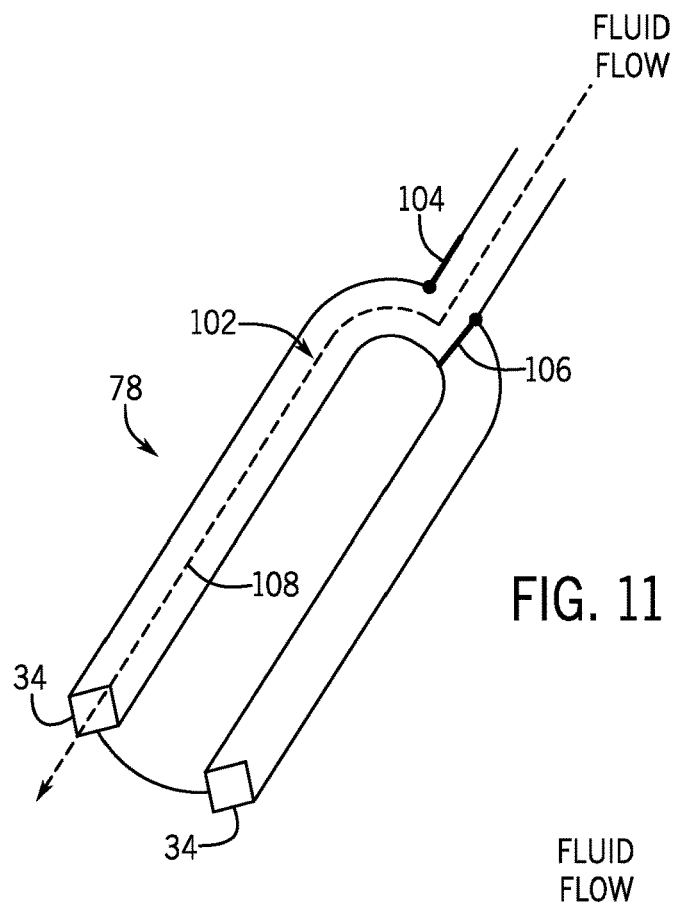
FIG. 11 illustrates an example routing mechanism to control a motion of an inflatable object, in accordance with embodiments described herein.
Figure 12:
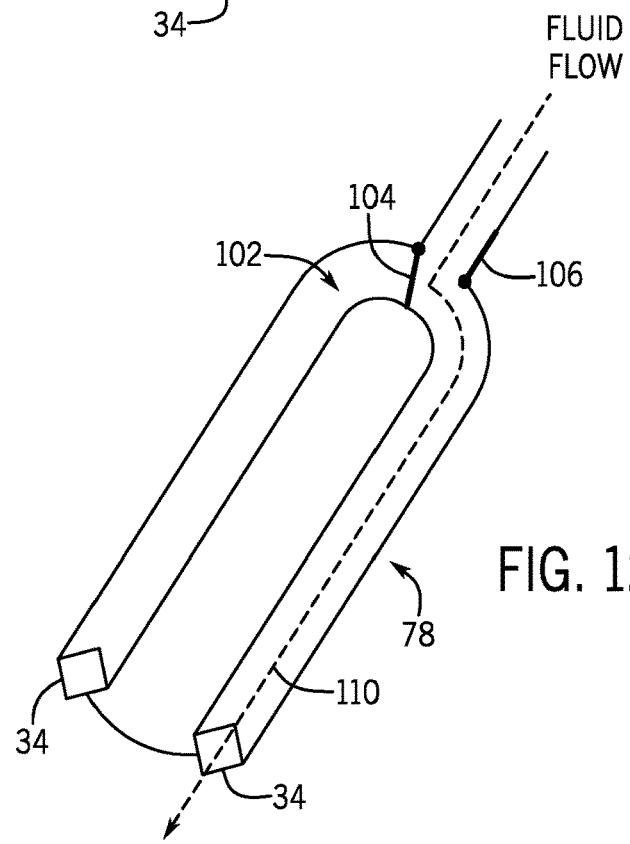
FIG. 12 illustrates an example routing mechanism to control a motion of an inflatable object, in accordance with embodiments described herein.

FIGS. 11 and 12 illustrate one example embodiment in which the movement of the extremity portion 78 may be controlled. As shown in FIG. 11, the extremity portion 78 may include a channel 102 that may direct fluid flow to the vent 34. The direction of the fluid flow may be adjusted via the mechanical system 32. In one embodiment, two moveable baffles 104 and 106 may be employed to control the motion of the extremity portion 78. That is, to cause the extremity portion 78 to move in a first direction 108, the first moveable baffle 104 may be positioned to allow the fluid to traverse in a first direction 108, as illustrated in FIG. 11. In addition, the second moveable baffle 106 may be positioned to block the fluid flow from reaching a portion of the channel 102. The fluid flow may the exit the extremity portion 78 via the vent 34.

Referring now to FIG. 12, to cause the extremity portion 78 to move in a different direction, the first moveable baffle 104 may be positioned to block the fluid flow into the first direction 108 and the second moveable baffle 106 may be positioned to allow the fluid flow into a second direction 110. The fluid flow may thus exit via the vent 34. The placement of the vents 34 and the directions of the fluid flow may cause the extremity portion 78 to move in the direction of the fluid flow.

In some embodiments, the type of fluid may be changed to cause the extremity portion 78 to move. For example, a lower density gas may be provided to one portion of the channel 102 while another portion of the channel 102 may be provided with a higher density gas. As such, the portion of the channel 102 that has the lower density gas may lift, thereby causing the extremity portion 78 to move in the direction of where the lower density gas is located.

In addition to the large-scale balloon 70, the IPS 10 may be incorporated into costumes and other objects that may be worn by a human user. For instance, the IPS 10 may be integrated into animated costumes worn by people. To enhance the visual presentation of the costume, the IPS 10 may cause the costume to grow, change shapes, or shrink certain parts of the costume while the person is wearing the costume.

Figure 13:
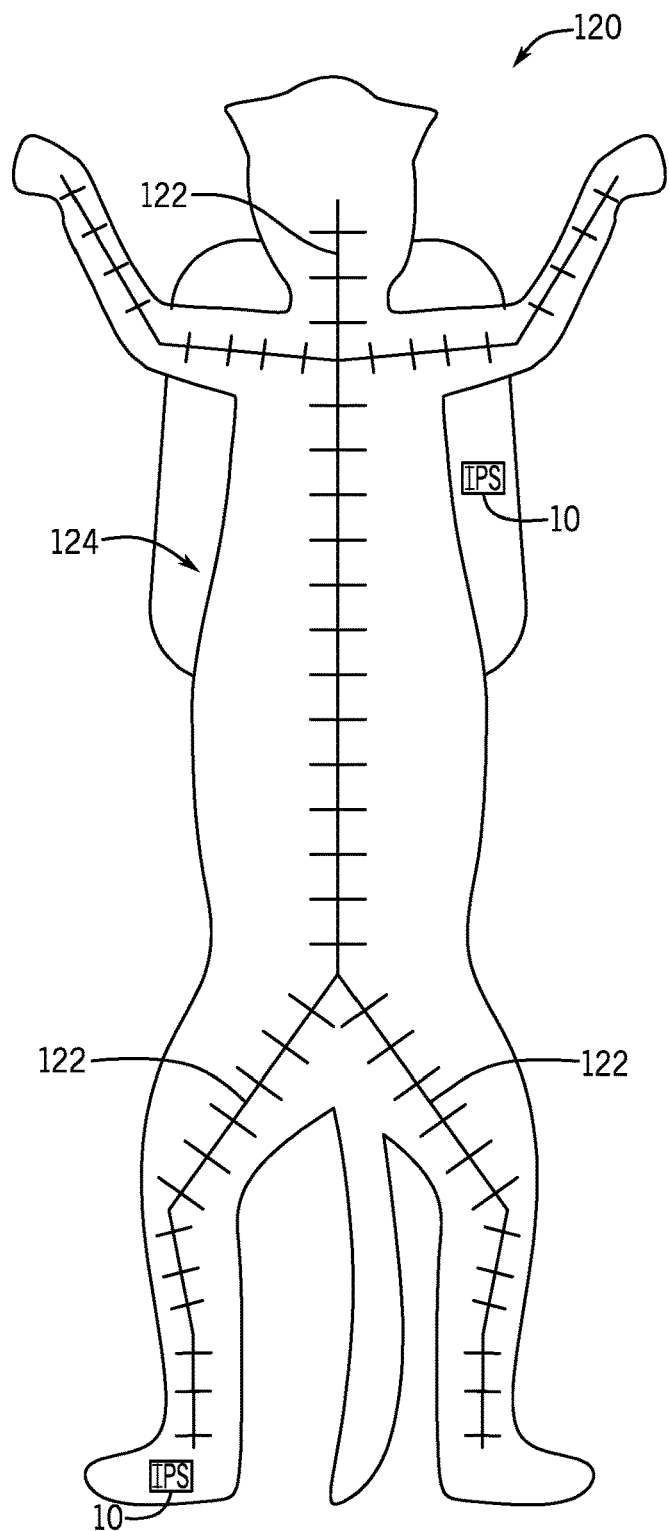
FIG. 13 illustrates a diagram of a skeleton incorporated into an inflatable object, in accordance with embodiments described herein.
Figure 14:
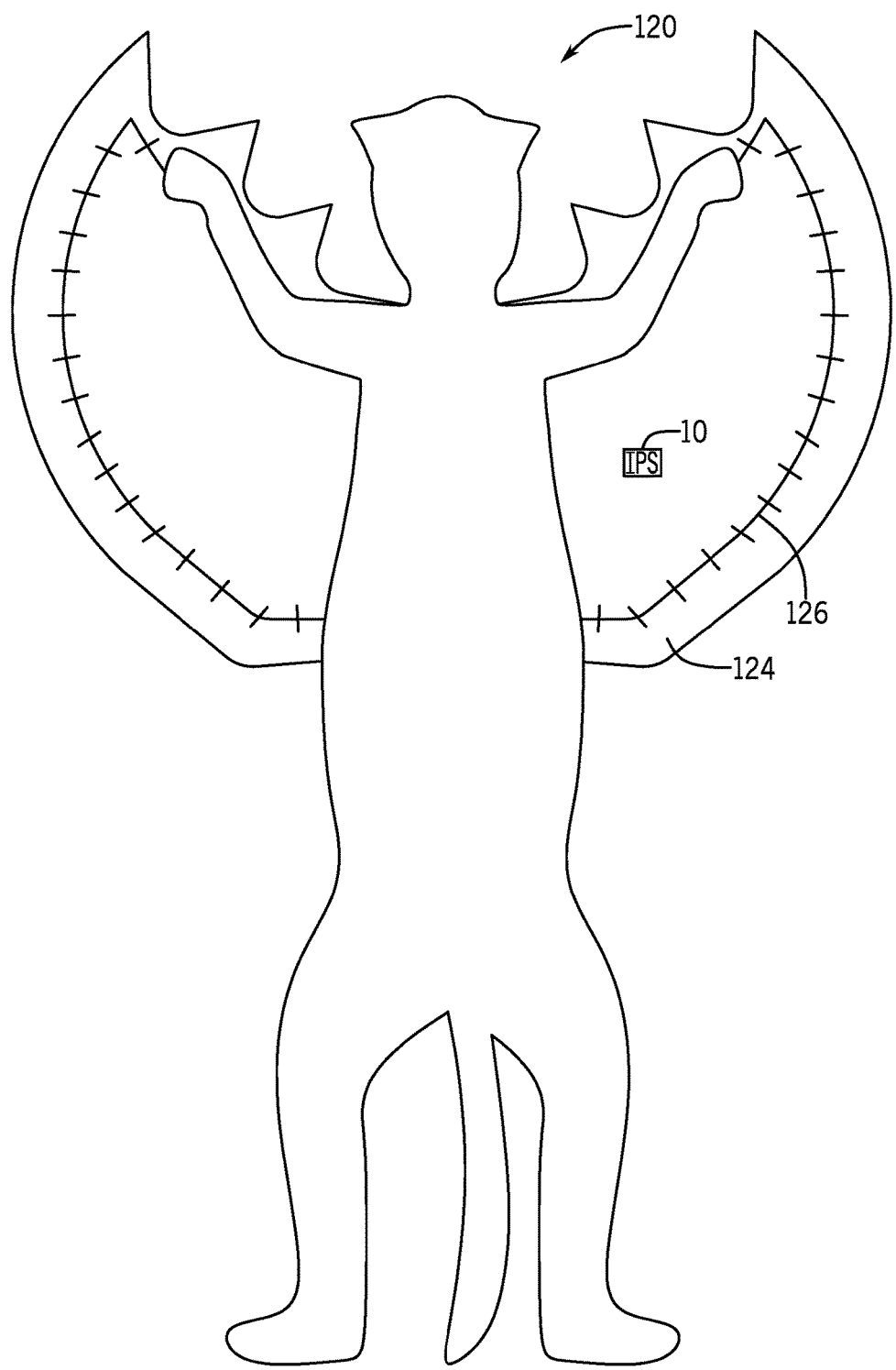
FIG. 14 illustrates a diagram of the inflatable object of FIG. 13 after the inflatable pneumatic system has modified the inflatable object, in accordance with embodiments described herein.

Keeping this in mind, FIGS. 13 and 14 illustrate a costume 120 that may incorporate the IPS 10 to cause the costume 120 to change shapes. Referring to FIG. 13 first, the costume 120 may include a skeletal structure 122 that may be integrated with the costume 120 to support the weight of the costume 120. The skeletal structure 122 (which may be an exoskeleton or endoskeleton) may be attached to the lining or material of the costume 120. In addition, the skeletal structure 122 may couple to a human user in one or more locations to allow the human user to control the motion of the costume 120.

In certain embodiments, the costume 120 may be made of an inflatable material or a material that may store or keep a fluid, such as the inflatable object 12. In this instance, a human user may be provided a breathing tube or the like to breath inside the enclosed costume 120.

To change the shape of the costume 120, the IPS 10 may push fluid into a portion 124 of the costume 120. The portion 124 may be designed to rest in a particular position or shape when deflated and take another shape when inflated. By way of example, the portion 124 may form wings when inflated, as depicted in FIG. 14. In some embodiments, the portion 124 may include a separate skeletal structure 126 that may be coupled to the mechanical system 32 discussed above. As such, the skeletal structure 126 may be moved in a mechanical fashion by controlling motors and the like that are coupled to the separate skeletal structure 126, while the portion 124 is inflated.

In addition to providing pneumatic technology in large-scale balloons, similar technology may be incorporated into smaller-scale balloons that may be provided as souvenirs in an amusement park or the like. The smaller-scale balloons may include a fluid supply and pump (e.g., electric motor, fan) along with gas directing mechanisms, such as the moveable baffles described above, that cause the balloon to move in a certain direction. In one embodiment, the control system 40 may be employed by the user of the smaller scale balloon to control the movements of the gas directing mechanisms and the pump to control the movements of the balloon.

Figure 15:
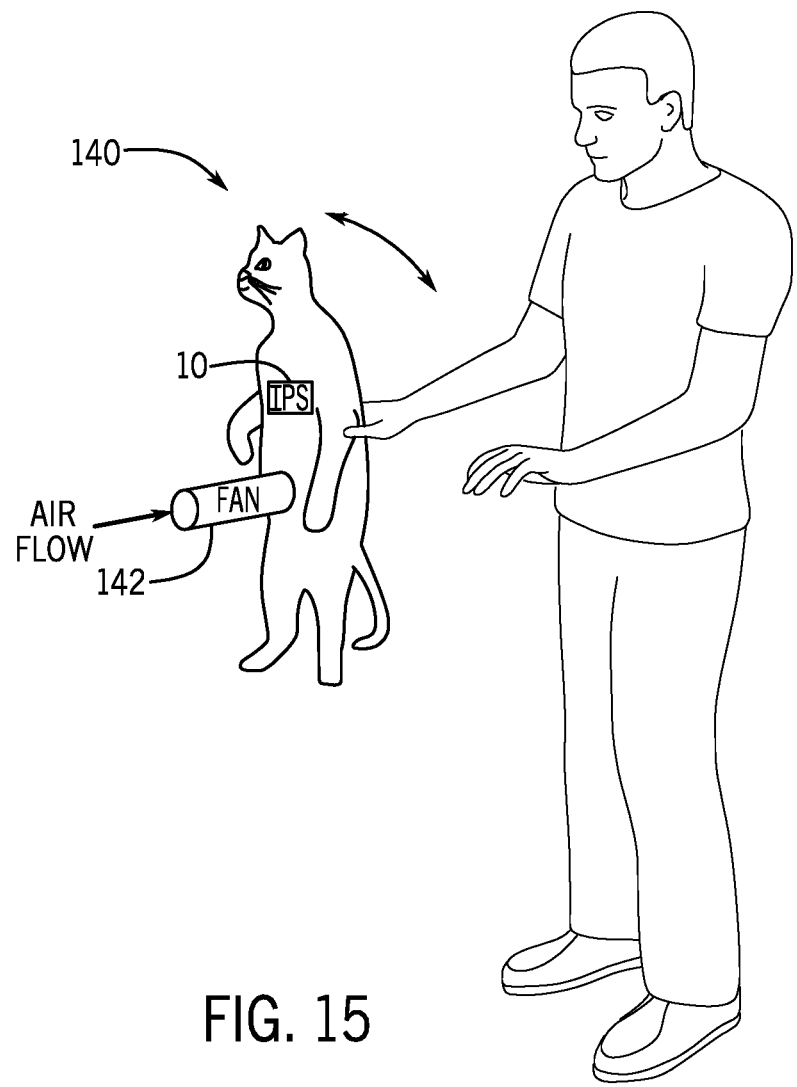
FIG. 15 illustrates a diagram of scaled inflatable object, in accordance with embodiments described herein.

By way of example, FIG. 15 illustrates a small-scale balloon 140 that may include the IPS 10 to control the inflation and movement of the small-scale balloon 140. In certain embodiments, the small-scale balloon may be implemented using the same techniques and systems described above for the large-scale balloon 70. However, the small-scale balloon 140 may include a small fan 142 (instead of large scale pumps, fans or other fluid movers) to draw air into the small-scale balloon 140 to inflate the small-scale balloon 140. In some embodiments, the small-scale balloon 140 may be coupled to a separate fluid source that may include a gas or liquid provided to the small-scale balloon 140 during operation. For example, a bladder filled with water may be compressed to provide fluid flow. In embodiments using a fan, gas may also exit the small-scale balloon 140 to provide cooling for a user.

The IPS 10 may control the movement or motion of the small-scale balloon 140 based on inputs received via the control system 40, which may include a smart phone or another suitable device. Additionally, IPS 10 may control the motion of the small-scale balloon 140 based on inputs received via the sensors 22. For instance, an amusement park may include various transmitters that may provide signals detectable by the sensors 22, such that the signal may cause the IPS 10 to alter positions or motions of the small-scale balloon 140.

Figure 16:
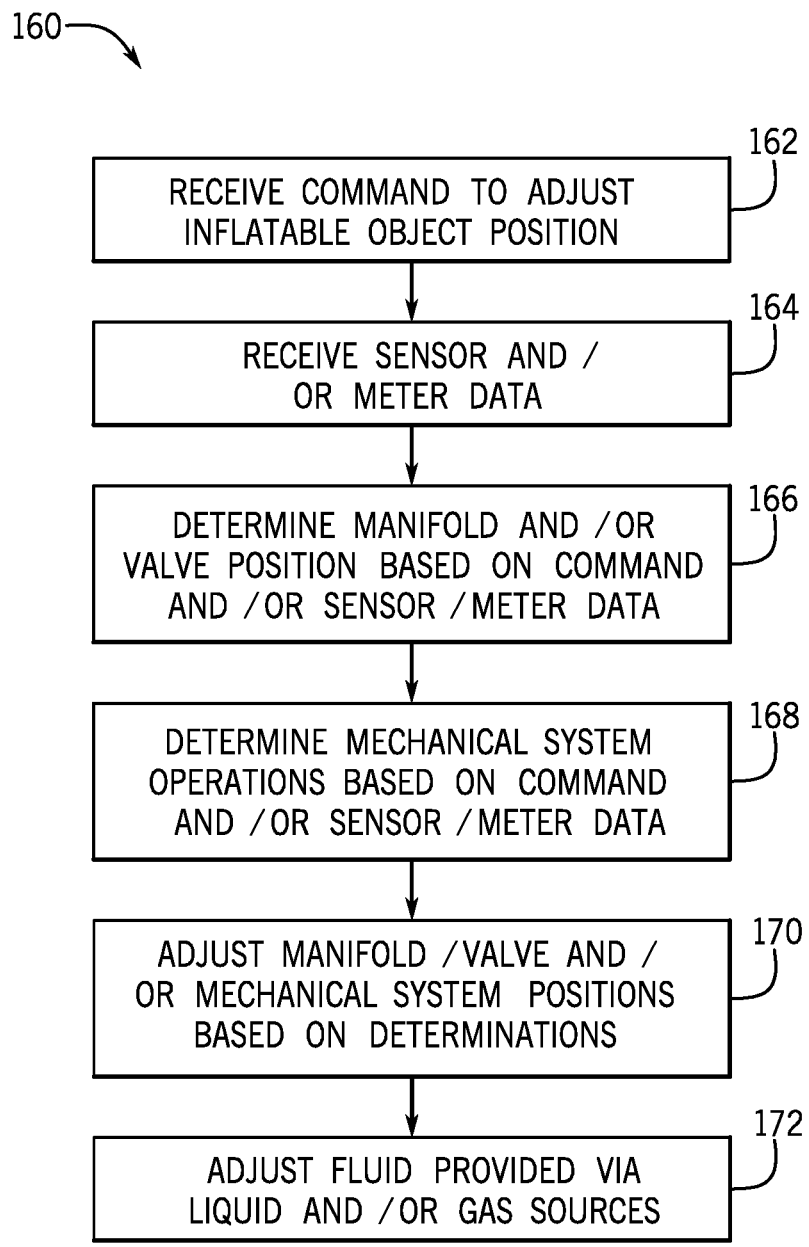
FIG. 16 illustrates a flow chart of a method for adjusting a position of an inflatable object, in accordance with embodiments described herein.

With the foregoing in mind, FIG. 16 illustrates a flow chart of a method 160 for controlling the motions of the large-scale balloon 70, the small-scale balloon 140, or other suitable inflatable object 12 in accordance with the embodiments described herein. Although the following description of the method 160 is detailed as being performed by the control system 40, it should be noted that any suitable computing system may perform the method 160 described below. Moreover, it should be noted that although the method 160 is described below in a particular order, the method 160 may be performed in any suitable order.

Referring now to FIG. 16, at block 162, the control system 40 may receive a command to adjust a position or motion of the inflatable object 12. The received command may correspond to a user input that specifies a particular motion or desired position for the inflatable object 12 or a portion of the inflatable object 12. In some embodiments, the command may be transmitted from other computing systems or transmitters that are dispersed at different geographical locations, landmarks, and the like. The transmitters may include radio frequency transmitters and other wireless signal transmitters that may send a signal containing the command therein.

In some embodiments, the command may be generated by the control system 40 based on a proximity to a particular location, an image acquired via the control system 40, or the like. That is, in an amusement park environment, the control system 40 may detect that the user is located near a particular landmark and, in response to being located within a certain proximity to the landmark, the control system 40 may generate a command to cause the inflatable object 12 to adjust its motion or positions.

In yet another embodiment, the command may be generated by the control system 40 in response to detecting audio inputs or signals. For instance, the user may speak a phrase to the control system 40, which may then generate a command based on the detected phrase. In the same manner, the command may be generated based on certain inputs detected via a video input. That is, the control system 40 may detect facial features or expressions via video of a user and generate a command based on the detected facial features or expressions. Indeed, in some embodiments, motion of a user that is detected via the control system 40 may be mimicked by aspects of the manipulated inflatable (e.g., the small-scale balloon 140).

With the foregoing in mind, at block 164, the control system 40 may receive data from the sensors 22, the meters 20, and the like. The data from the sensors 22 may include audio data, visual data, light intensity (e.g., infrared) data, and the like. The data from the meters 20 may include fluid pressure data, fluid temperature data, fluid velocity data, and the like. In some embodiments, the sensors 22 may be disposed at different locations within the inflatable object 12 and thus may receive data concerning different positions with respect to the inflatable object 12.

The data from the sensors 22 may also include a level or amount of fluid available in the liquid source 26 or the gas source 28. In addition, the sensors 22 disposed on the liquid source 26 or the gas source 28 may include any suitable measurement related to the operation of the liquid source 26 or the gas source 28. The data from the sensors 22 and the meters 20 may provide information related to the current properties of the inflatable object 12. For example, the information may detail whether the inflatable object 12 is inflated, has sufficient pressure, is leaking, is moving in a desired manner, and the like.

At block 166, the control system 40 may determine the present positions of the manifold 16, the valves 18, and the like. The positions of the manifold 16 and the valves 18 may provide an indication with regard to how the inflatable object 12 is currently positioned. In addition to the positions of the manifold 16 and the valves 18, at block 168, the control system 40 may receive data from the mechanical system 32 regarding the current operational parameters of the mechanical system 32. The current operation parameters may include the current positions of various motors, baffles, levers, and other mechanical components that may be integrated in the inflatable object 12.

Based on the positions of the manifold 16 and the valves 18, as well as the current operational parameters of the mechanical system 32, the control system 40 may determine the fluid flow within the inflatable object 12. In addition, the control system 40 may determine a current shape or position of the inflatable object 12. At block 170, the control system 40 may then adjust the positions of the manifold 16, the valves 18, the mechanical system 32, or the like based on the command received at block 162 and the other data received at blocks 164, 166, and 168. That is, the command may correspond to causing a portion of the inflatable object 12 to inflate, to move, display a particular facial expression, retract, or the like. Based on the current properties of the inflatable object 12, as determined via the data received at blocks 164, 166, and 168 and the desired properties of the inflatable object 12 with respect to the command, the control system 40 may determine adjustments to the manifold 16, the valves 18, the mechanical system 32, or the like.

After determining the adjustments to the manifold 16, the valves 18, or the mechanical system 32, the control system 40 may send instructions to controllers or control systems coupled to the manifold 16, the valves 18, the mechanical system 32, or the like. The instructions may cause the controllers or the control systems to adjust the positions of the manifold 16, the valves 18, or the mechanical system 32 to adjust its current settings to achieve a desired movement or shape that corresponds to the command received at block 162.

In addition to adjusting the positions of the manifold 16, the valves 18, or the mechanical system 32, at block 172, the control system 40 may adjust the fluid flow provided via the liquid source 26 or the gas source 28 based on the command and the data received at blocks 162, 164, and 166. For example, if the command received at block 162 requests that a portion of the inflatable object 12 is lifted, the control system 40 may send a command to a controller or control system that controls the gas source 28 to provide a gas with a lower density than currently present in the portion of the inflatable object 12 to cause the portion to rise or actuate an inflatable portion that expands or contracts to cause the desired movement.

In any case, the control system 40 may use a variety of control mechanisms (e.g., liquid source 26, gas source 28, valves 18, manifold 16, mechanical system 32) to coordinate the shape or positions of the inflatable object 12. A combination of these control mechanisms may allow the control system 40 to provide more fluid or life-like movement and expressions exhibited by the inflatable object 12. Moreover, by incorporating the inflatable pneumatic system 10 into the inflatable object 12, human guests may interact and touch the inflatable object 12.

Although the foregoing discussion related to the inflatable object 12 has been discussed with respect to gas, it should be noted that each of the embodiments described herein may also be employed with liquid fluids. That is, the IPS 10 may be placed in an aquatic environment, which may be viewed through a glass material or at an elevation above the aquatic environment. In the aquatic environment, the inflatable object 12 of may be filled with a liquid to form various shapes. For instance, the material that makes up the inflatable object 12 may rest at the surface of the aquatic environment until a liquid (e.g., water) is pumped into the material, thereby generating a structure, object, or the like based on the shape of the material.

With this in mind, it should be understood that the embodiments described above may be implemented using liquids that are pumped into the inflatable object 12 via the liquid source 26. The liquid source 26 may integrate with a hydraulic system to cause the inflatable object 12 to move. In addition, different types of liquids with different densities may be provided to different portions of the inflatable object 12. In some embodiments, the liquids may include water, water glycol, oil, doped water, or any other suitable liquid. In some embodiments, a combination of gas filled inflatable objects and liquid filled inflatable objects may also be used to control motion of a larger inflatable object or the like.

Inflatable Structural Objects in Amusement Park Environments

In addition to controlling the motion or position of inflatable objects 12, the IPS 10 may be incorporated into various amusement park exhibits to create structures that may be used to enhance a user's experience traversing an amusement park, participating in an amusement ride, and the like. For example, a structure may be formed by the IPS 10 to assist a user to gain access to an exhibit or a part of a ride. For instance, the inflatable object 12 may include a material or section that, when inflated, may form a ladder that enables a user to gain access to a certain portion of an exhibit or part of a ride that exists at some height. The inflatable ladder may be further inflated or deflated to access higher or lower heights, respectively.

Another example of incorporating the IPS 10 into an amusement park environment includes incorporation into an aquatic environment. Specifically, present embodiments may include the inflatable object 12 positioned within the water or at the surface of a pool. As such, the inflatable object 12 may be inflated to create an island structure or the like that guests may stand atop of during certain time intervals. In addition, cylindrical tubes may be inflated to project water out to a pool or wet play area for guests.

In addition, the inflatable object 12 may be inflated during the course of a ride or an exhibit to create obstacles for the ride or user during the user experience. In the same way, the inflatable object 12 may deflate, such that obstacles are removed during the course of a ride or exhibit. The inflatable object 12 may also inflate and deflate to different pressure levels to form an object having a hard surface to one having varying degrees of a soft or amorphous surface. As mentioned above with regard to the balloons, different portions of the inflatable material may be inflated or gas deflecting mechanisms may be controlled while gas is pumped into the material to make the resulting formation move, change shapes, and the like.

With the foregoing in mind, FIGS. 17-29 illustrate various embodiments in which the IPS 10 may be incorporated into various types of exhibits to provide different features and experiences for guests at an amusement park or the like. It should be noted that each of the embodiments described with respect to FIGS. 17-29 may include components of the IPS 10 detailed above. In addition, the embodiments described below may be combined with other embodiments described herein and may be employed to enhance a user's experience in an amusement park, during an amusement park ride, or the like.

Figure 17:
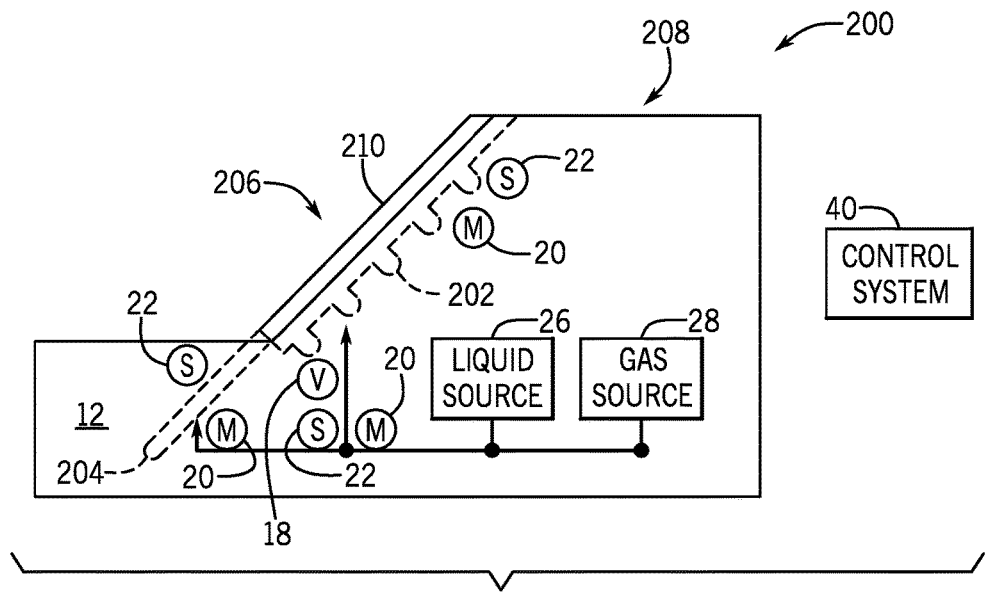
FIG. 17 illustrates a diagram of a first stage of an inflatable ladder structure, in accordance with embodiments described herein.
Figure 18:
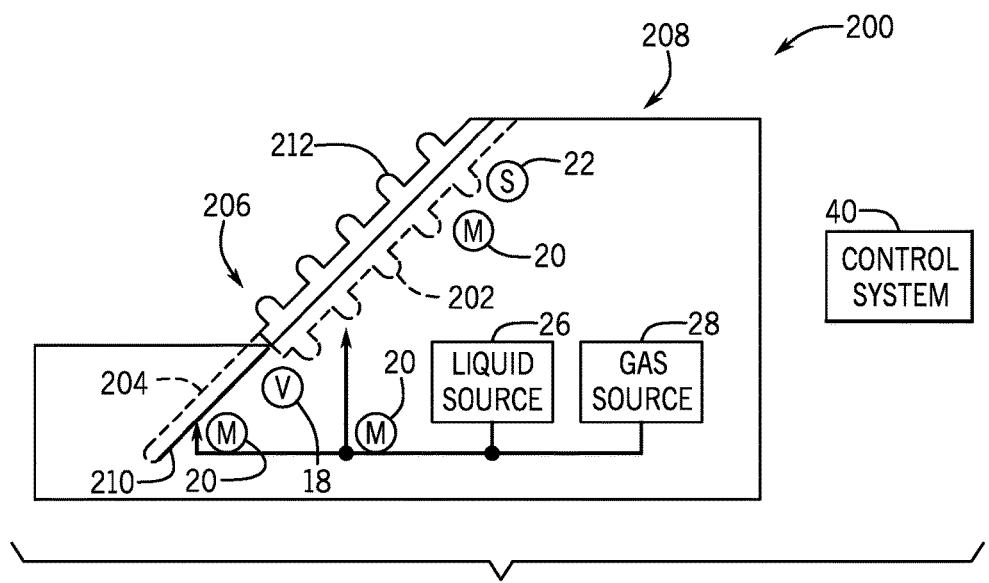
FIG. 18 illustrates a diagram of a second stage of inflatable ladder structure, in accordance with embodiments described herein.

Referring now to FIGS. 17 and 18, an inflatable ladder structure 200 is illustrated. More specifically, FIG. 17 illustrates cavities 202 and 204 that may embedded within the inflatable object 12. In certain embodiments, each cavity 202 may be supported by binding or certain mechanical frames (e.g., skeletal components) that may allow each cavity 202 and 204 to remain hollow when the inflatable object 12 is inflated.

The inflatable ladder structure 200 may include an incline 206 that may make it difficult for an individual to traverse the incline 206 or gain access to a top level 208. In certain embodiments, an inflatable tube 210 may be inflated to make the incline 206 function as a slide or prevent guests from easily reaching the top level 208. However, upon receiving a certain command or detecting an expected motion or action, the control system 40 (or other suitable device) may initiate a process to retract the inflatable tube 210 into the cavity 204. That is, the control system 40 may receive a signal or detect a presence of a guest via the sensors 22 and cause the inflatable tube 210 to deflate in response to receiving an expected signal or detecting an expected presence. For instance, a guest may recite an audible command, move in a particular manner, move an electronic device in a specific motion, or the like. The sensors 22 may detect these activities and send an indication of the detected activities to the control system 40, which may then coordinate the inflation or deflation of the inflatable tube 210, which may allow access to a feature (e.g., ladder) underneath.

In some embodiments, when deflating the inflatable tube 210, the control system 40 may send a signal to a pump or other device to pull air or liquid from the inflatable tube 210. The inflatable tube 210 may retract into the cavity 204 (e.g., via suction or mechanical actuation of a support) and allow another inflatable structure to be inflated. To cause the inflatable tube 210 to retract into the cavity 204, the control system 40 may control a mechanical actuator that pulls the inflatable tube 210 into the cavity 204.

In addition, referring to FIG. 18, the control system 40 may cause the liquid source 26 or the gas source 28 to inflate an inflatable ladder 212, which may be previously stored in the cavity 202. The inflatable ladder 212 may include steps or ledges that a guest may climb to traverse the incline 206 and reach the top level 208. In some embodiments, the inflatable ladder 212 may be separated into a number of portions that may each be individually inflated. In this case, the difficulty of traversing the incline 206 may be adjusted based on the number of portions of the inflatable ladder 212 that are inflated.

Figure 19:
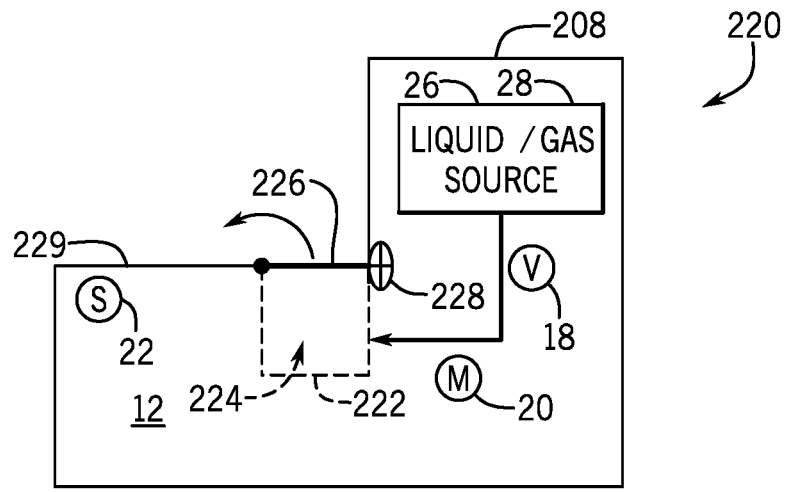
FIG. 19 illustrates a diagram of a first stage of an inflatable step structure, in accordance with embodiments described herein.
Figure 20:
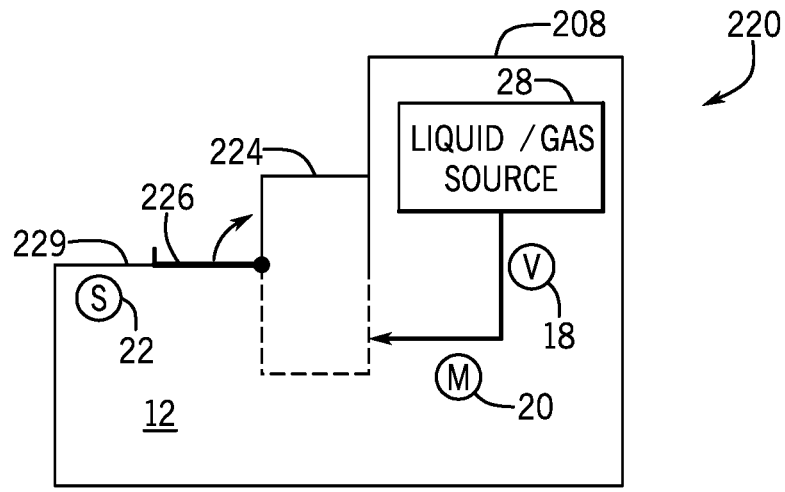
FIG. 20 illustrates a diagram of a second stage of inflatable step structure, in accordance with embodiments described herein.

In addition to ladder structures, steps may also be inflated and provide access to different parts of an amusement park exhibit. For instance, FIGS. 19 and 20 illustrate an inflatable step structure 220 in which a step is inflated to assist a guest to reach the top level 208. Referring first to FIG. 19, the inflatable step structure 220 may include a cavity 222 that may store an inflatable step 224. In some embodiments, a lid structure 226 may latch or couple to a coupling feature 228 attached to the inflatable object 12 and block access to the cavity 222.

The top level 208 may be positioned at a height above a lower level 229, such that it may be beneficial or easier to access the top level 208 with the inflatable step 224 positioned at a height between the lower level 229 and the top level 208. With this in mind, the control system 40 or any other suitable device may inflate the inflatable step 224 in response to receiving a signal, a command, a detected presence, or the like.

When inflating the inflatable step 224, the step may push against the lid structure 226, such that the lid structure 226 rotates 0 to 180 degrees to allow the inflatable step 224 to inflate and provide a step to access the top level 208. In some embodiments, the lid structure 226 may be coupled to a corner of the inflatable step 224 such that it remains vertical when the inflatable step 224 is inflated. It should be noted that the lid structure 226 may also be removed from the inflatable step structure 220 and, instead, the cavity 222 may be visible when the inflatable step 224 is deflated. As such, the cavity 222 may provide an additional obstacle to prevent a guest from reaching the top level 208.

In addition to providing assistance to guests, the IPS 10 may be used to produce obstacles that block access to different areas of the amusement park or increase a difficulty for a guest in gaining access to a certain area of an amusement park attraction. With this in mind, FIGS. 21 and 22 illustrate an example obstacle structure 230 that may be inflated or deflated based on input received via the sensors 22, a command received via the control system 40, or other inflation triggers discussed above.

Figure 21:
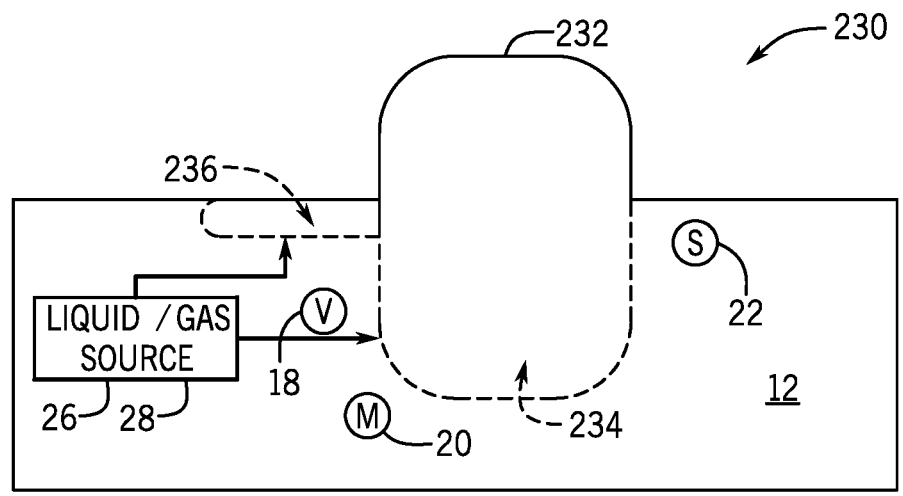
FIG. 21 illustrates a diagram of a first stage of an inflatable obstacle structure, in accordance with embodiments described herein.
Figure 22:
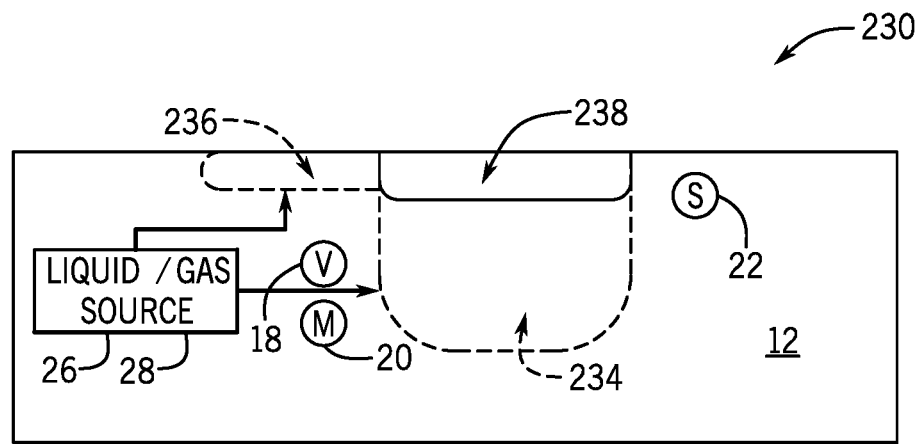
FIG. 22 illustrates a diagram of a second stage of an inflatable obstacle structure, in accordance with embodiments described herein.

Referring to FIG. 21, an inflatable obstacle 232 may protrude from the inflatable object 12 to prevent a guest from accessing a portion or area within the amusement park. In some embodiments, the inflatable obstacle 232 may be shaped as a boulder or rock that may be difficult to traverse or climb. That is, the inflatable obstacle 232 may have an amorphous or non-uniform shape that is difficult for a guest to climb over.

The obstacle structure 230 may also include cavities 234 and 236. The cavity 234 may store the inflatable obstacle 232 when it is deflated. To maintain a walkway above the cavity 234, an inflatable lid 238, as shown in FIG. 22, may be inflated to cover the cavity 234. In one embodiment, the inflatable lid 238 may be retracted and stored in the cavity 236 when the inflatable obstacle 232 is present. In some embodiments, solid or rigid structures (e.g., a solid lid) may be maneuvered into desired locations by inflatable actuators.

Figure 23:
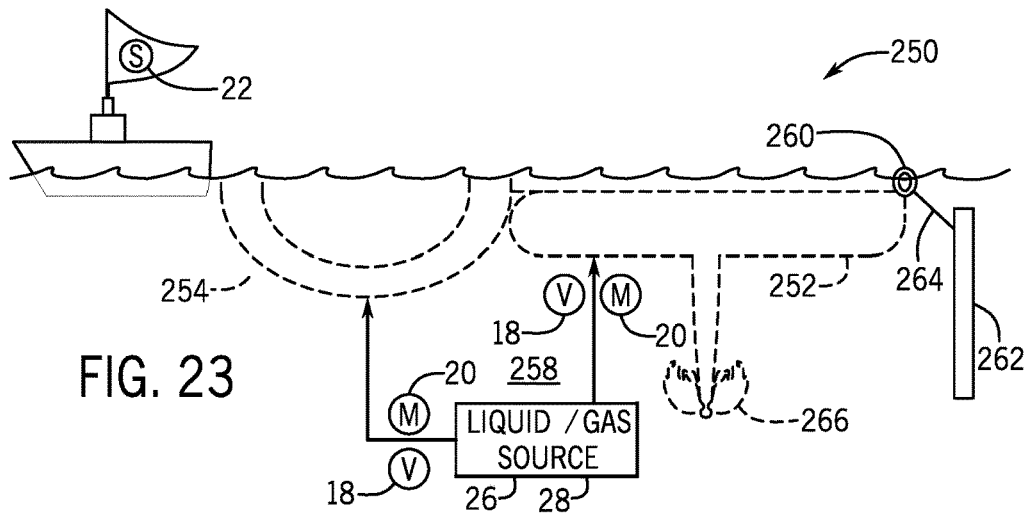
FIG. 23 illustrates a diagram of a first stage of inflatable island structure, in accordance with embodiments described herein.
Figure 24:
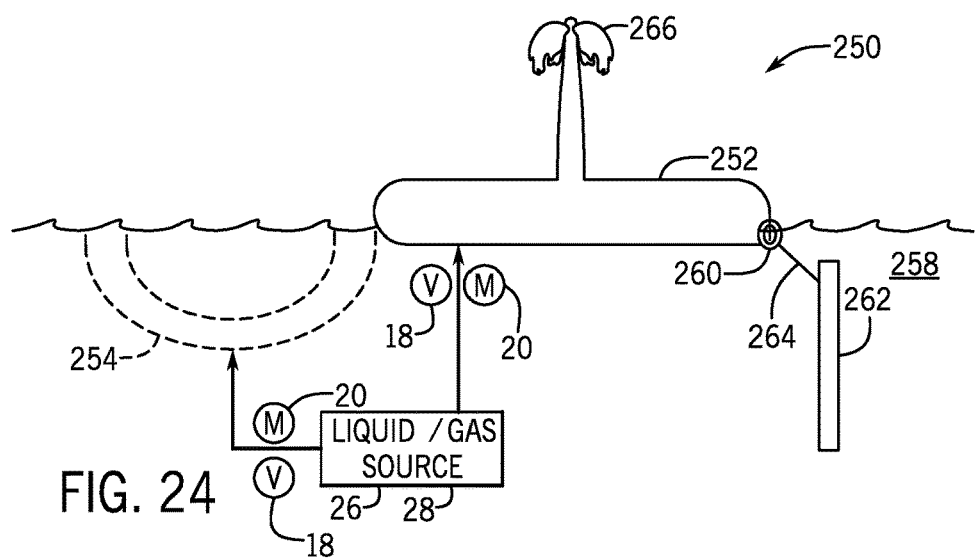
FIG. 24 illustrates a diagram of a second stage of inflatable island structure, in accordance with embodiments described herein.
Figure 25:
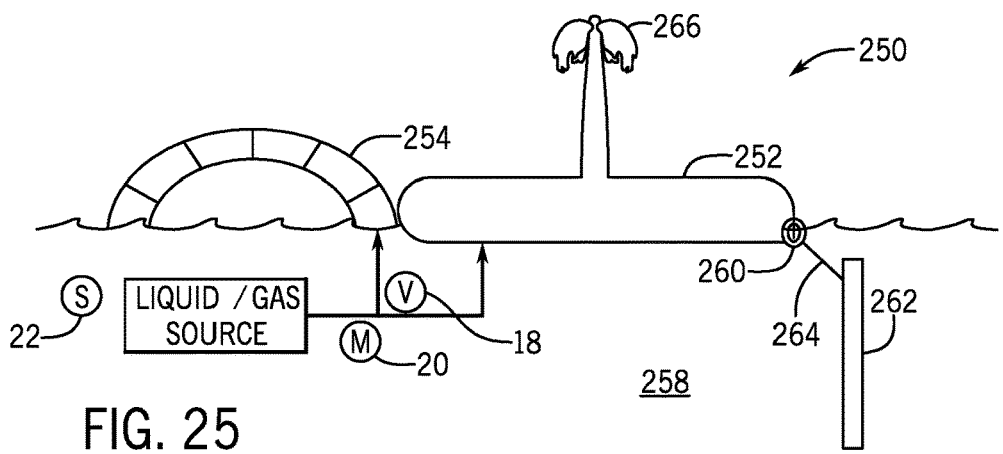
FIG. 25 illustrates a diagram of a third stage of inflatable island structure, in accordance with embodiments described herein.

In aquatic environments, inflatable objects 12 disposed in water may be inflated with some gas or pumped with a liquid that may cause the inflatable objects 12 to float above the water. With this in mind, FIGS. 23, 24, and 25 illustrate an inflatable aquatic system 250 that may include different types of inflatable objects such as an inflatable island structure 252, an inflatable bridge structure 254, and the like. Referring first to FIG. 23, the inflatable island structure 252 and the inflatable bridge structure 254 may be submerged in a liquid 258 (e.g., water). As such, in certain embodiments, the inflatable island structure 252 and the inflatable bridge structure 254 may be deflated or void of fluid, such that the liquid 258 causes the inflatable island structure 252 and the inflatable bridge structure 254 to be submerged. In some embodiments, the inflatable island structure 252 and the inflatable bridge structure 254 may be filled with a liquid that has a higher density than the liquid 258, thereby causing the inflatable island structure 252 and the inflatable bridge structure 254 to sink, as depicted in FIG. 23. However, in other embodiments, the inflatable island structure 252 and the inflatable bridge structure 254 may be deflated, such that they collapse on or in the liquid 258.

When inflating the inflatable island structure 252, the control system 40 or the like may cause the fluid source (e.g., liquid source 26, gas source 28) to produce a suitable fluid (e.g., liquid, gas) to fill the inflatable island structure 252 via the valve 18 or the like. To keep the inflatable island structure 252 stable and prevent it from moving in the liquid 258, the inflatable island structure 252 may include a coupling feature 260 (e.g., hook) that may be secured to a post 262 via a wire 264, chain, or the like.

After the inflatable island structure 252 is filled with a fluid that is lighter than the surrounding liquid 258, the inflatable island structure 252 may surface above the liquid 258. In some embodiments, the inflatable island structure 252 may be filled such that it maintains a certain pressure that supports the weight of multiple guests. That is, guests may walk on the inflatable island structure 252. In addition, the inflatable island structure 252 may include additional inflatable objects 12, such as an inflatable tree 266 or other inflatable vegetation objects, to enhance the appearance of the inflatable island structure 252.

The inflatable aquatic system 250 may also include inflatable building or road structures, such as the inflatable bridge structure 254. In some embodiments, the inflatable bridge structure 254 may provide access to the inflatable island structure 252. That is, users may traverse the inflatable bridge structure 254, which may retain sufficient pressure to support the weight of multiple guests.

It should be noted that liquid or gas may also be provided to the various types of inflatable objects 12 described herein. That is, the liquid 258 may include a certain type of liquid having one density value, and the inflatable objects 12 may be filled with another type of liquid or gas that has a lighter density than the liquid 258. As a result, the inflatable objects 12 may float above the liquid 258. The liquid containers that act as inflatable objects 12 may be composed of a latex material sufficient to act as a bladder to hold the appropriate amount of liquid.

Like the inflatable objects 12 described in FIGS. 17-22, the inflatable island structure 252 may be controlled via a control system 40 or another suitable component. As such, data from the sensors 22, meters 20, and the like may be used to implement the method 160 to control the inflation and deflation or fill and drainage of the inflatable objects 12 described in each of the embodiments presented herein.

In addition to controlling environmental aspects of an amusement park, the IPS 10 may be incorporated into virtual reality or augmented reality environments to simulate a physical environment for a simulated or virtual object. For instance, in virtual reality-based systems the inflatable material may be inflated to different shapes to provide haptic feedback to provide the sense of touch while using the virtual reality system. That is, as the user sees a virtual object in the virtual reality system, the IPS 10 may inflate different inflatable objects 12 to form shapes that are presented in the virtual reality environment.

Figure 26:
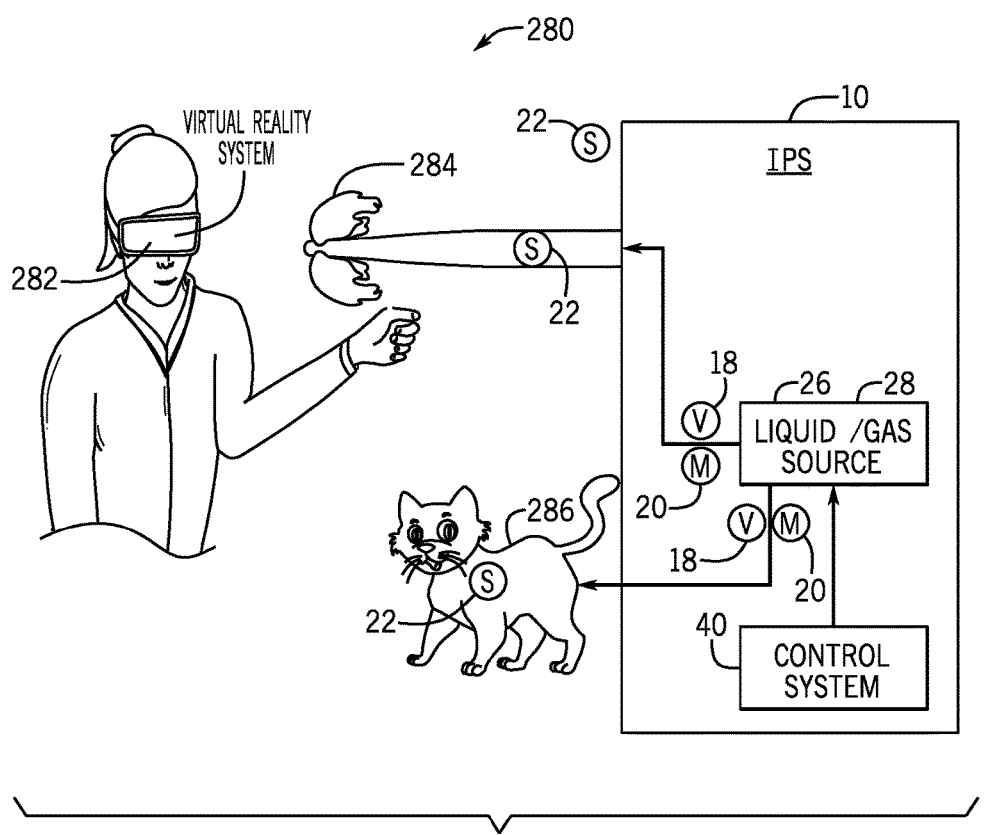
FIG. 26 illustrates a diagram of a virtual reality system operating with the inflatable pneumatic system, in accordance with embodiments described herein.

Keeping this in mind, FIG. 26 illustrates a virtual reality environment 280 that may involve the IPS 10 to create physical representations of items that may be presented via a virtual reality system 282. The virtual reality system 282 may include similar components as described with respect to the control system 40 of FIG. 2. Generally, the virtual reality system 282 may include a display 52 that may be positioned around a user's eyes, such that a view of the actual environment surrounding the user's eyes is limited. The display 52 may then present a virtual world or environment that may change as the user traverses or moves through a controlled (e.g., room) environment.

To enhance the user experience in traversing this virtual world, the IPS 10 may inflate various inflatable objects 12 in the controlled environment to simulate an actual object that corresponds to an object presented in the display 52. For example, the IPS 10 may be incorporated into a room or some suitable environment in which a user may traverse through via walking, train ride, automobile ride, or the like. As the user encounters various virtual objects via the display 52 of the virtual reality system 282, the IPS 10 may inflate an inflatable object 12 that corresponds to the virtual objects depicted in the display 52. By way of example, if the display 52 presents a virtual tree, the IPS 10 may inflate an inflatable tree object 284. In the same manner, if the display 52 presents a virtual cat, the IPS 10 may inflate an inflatable cat object 286. In certain embodiments, the IPS 10 may coordinate the inflation of each object based on the location of the user and the time in which the display 52 presents the corresponding virtual object. In this way, the user may physically touch an inflatable object 12 that may physically match the virtual object presented in the display 52. This may conserve space within the environment by activating and deactivating props within the same area.

In some embodiments, the virtual reality system 282 may receive data from the sensors 22 that may be disposed on the inflatable objects 12 to ensure that the visualized virtual objects match the positions and motions of the actual inflatable objects 12. As such, the inflatable objects 12 in the virtual reality environment 280 may include various features described above to cause the objects to move in a controlled manner. The controlled motion may be mimicked by the virtual reality system 282, such that the user may simultaneously feel the movement of the inflatable objects 12.

To further enhance the user experience in the virtual reality environment 280, the inflatable objects 12 may be textured and include different layers of material to mimic the represented object. For instance, the inflatable cat object 286 may include a fur-like material disposed on the material that forms the inflatable object 12, such that the inflatable cat object 286 physically feels like a cat.

Figure 27:
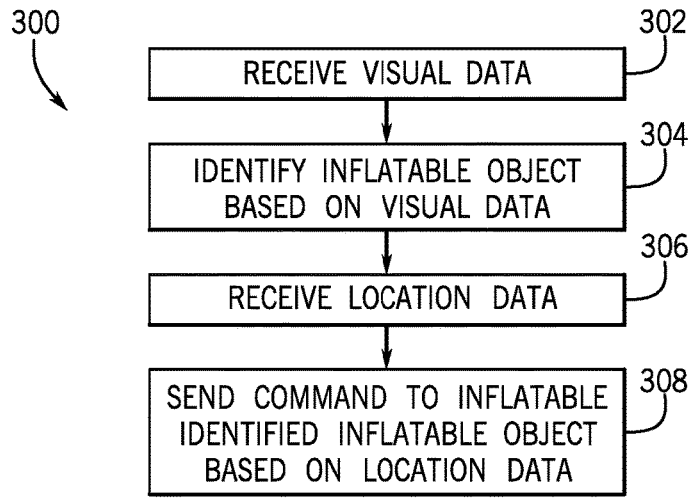
FIG. 27 illustrates a flow chart of a method for inflating inflatable objects in the virtual reality environment using the inflatable pneumatic system, in accordance with embodiments described herein.

With the foregoing in mind, FIG. 27 illustrates a method 300 for adjusting the virtual reality environment 280 using inflatable objects 12. By way of example, the following description of the method 300 will be discussed as being performed by the control system 40, but it should be understood that any suitable computing system may perform the method 300 described herein.

Referring now to FIG. 27, at block 302, the control system 40 may receive visual data related to virtual objects that are presently being displayed by the virtual reality system 282. The visual data received at block 302 may be transmitted to the control system 40 via a communication link between the control system 40 and the virtual reality system 282. In some embodiments, pointers or metadata regarding the visual data may be transmitted to the control system 40 to indicate where the user is positioned in the virtual environment. By using pointers, the control system 40 may preserve bandwidth and avoid receiving the visual data, which may be data intensive.

At block 304, the control system 40 may identify an inflatable object 12 that may be present in the virtual reality environment 280 based on the visual data. That is, the control system 40 may identify the inflatable object 12 that corresponds to the virtual object presented in the virtual world based on the visual data, the pointers, and the like.

In addition to the visual data, the control system 40 may, at block 306, receive location data that indicates the user's position in the virtual reality environment 280 or the user's position with respect to the inflatable objects. Based on the location of the user, the control system 40 may determine when to inflate the identified inflatable object 12 to ensure that the inflatable object 12 is accessible to the user when the corresponding virtual object appears to be accessible according to the virtual reality system 282. For example, the control system 40 may inflate the inflatable object 12 when the user is detected within a threshold distance from the respective inflatable object 12.

At block 308, the control system 40 may send a command to the valve 18 to inflate the identified inflatable object via the liquid source 26 or the gas source 28 based on the location of the user. In certain embodiments, the virtual reality system 282 may receive feedback data from sensors 22 in the virtual reality environment 280 to present virtual objects at certain distances away from the user's virtual position to match the actual distance that the user is with respect to the corresponding inflatable objects 12. As a result, the user's experience in the virtual reality system 282 is enhanced by the physical objects that he is able to interact with. Objects, such as the inflatable tree object 284, may include electronic tags (e.g., radio frequency identification tags (RFIDs)) on certain positions to facilitate identifying location data and subsequent manipulation of the object and/or image data to create overlap.

In some embodiments, the virtual reality environment 280 may portray a maze or labyrinth visualization that the user is to navigate through. For example, the IPS 10 may be incorporated into a funhouse or maze exhibit that may create or remove walls within the exhibit by inflating or deflating different inflatable objects 12. In another embodiment, a moonwalk may have different features that may be jumped upon when different portions of the inflatable material are inflated. For instance, the ceiling may become higher or lower by deflating or inflating different portions of the inflatable object 12 positioned adjacent to the ceiling of the moonwalk. In one embodiment, the virtual reality environment may include a maze exhibit that has walls that may form and disappear dynamically during the course of traversing the maze, interacting with various objects within the maze, and the like.

Figure 28:
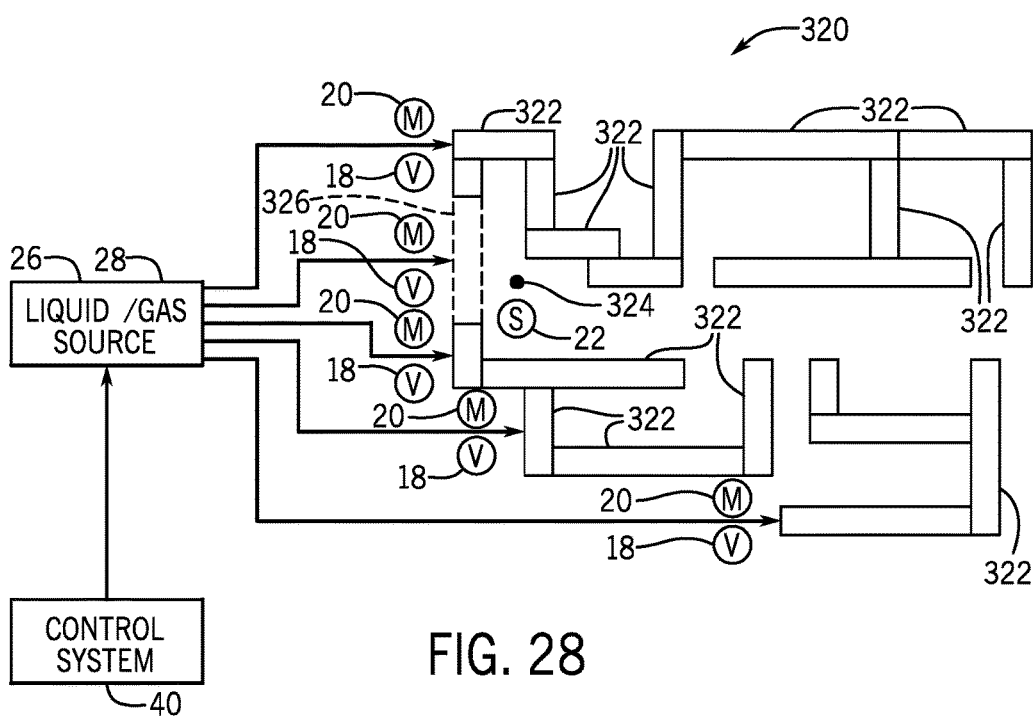
FIG. 28 illustrates a diagram of an inflatable maze structure, in accordance with embodiments described herein.

By way of example, FIG. 28 illustrates an inflatable maze structure 320 in which a guest of an amusement park may traverse. In some embodiments, the inflatable maze structure 320 may include a number of inflatable walls 322. The inflatable walls 322 may be coupled to the liquid source 26 or the gas source 28 via the valves 18 discussed above. As guests traverse the inflatable maze structure 320, the control system 40 or the like may receive an input or sensor data via the sensors 22 to cause the control system 40 to deflate one or more of the inflatable walls 322. For example, the guest traversing the inflatable maze structure 320 may reach a point 324 where the control system 40 expects to receive an input signal or detect a motion of the user to cause the control system 40 to deflate an inflatable wall 326. In certain embodiments, the inflatable wall 326 may provide an exit or way out of the inflatable maze structure 320.

In addition to providing different exit points in the inflatable maze structure 320, the control system 40 may control the pattern or design of the inflatable maze structure 320 by inflating and deflating different inflatable walls 322. In this way, the inflatable maze structure 320 may provide a new experience and involve a new solution each time a user traverses the same maze exhibit.

In certain embodiments, the inflatable maze structure 320 may be integrated with the virtual reality system 282 described above. That is, in the same manner that the control system 40 inflated inflatable objects 12 while the user traversed the virtual reality environment 280, the control system 40 and the virtual reality system 282 may coordinate the inflation of inflatable objects 12 with the presentation of corresponding virtual walls depicted via the virtual reality system 282. As such, the inflatable maze structure 320 may enhance the user's experience in a virtual maze presented by the virtual reality system 282.

In addition to mazes, inflatable walls 322 may be inflated when guests are detected as approaching restricted areas. For instance, to provide certain views, a park or exhibit may provide viewing angles for guests without any visual obstructions to view certain park features, exhibits, shows, or the like. However, upon detecting of a guest approaching or entering a restricted area, the control system 40 may inflate the inflatable walls 322 to prevent the guest from gaining access to the restricted area.

Figure 29:
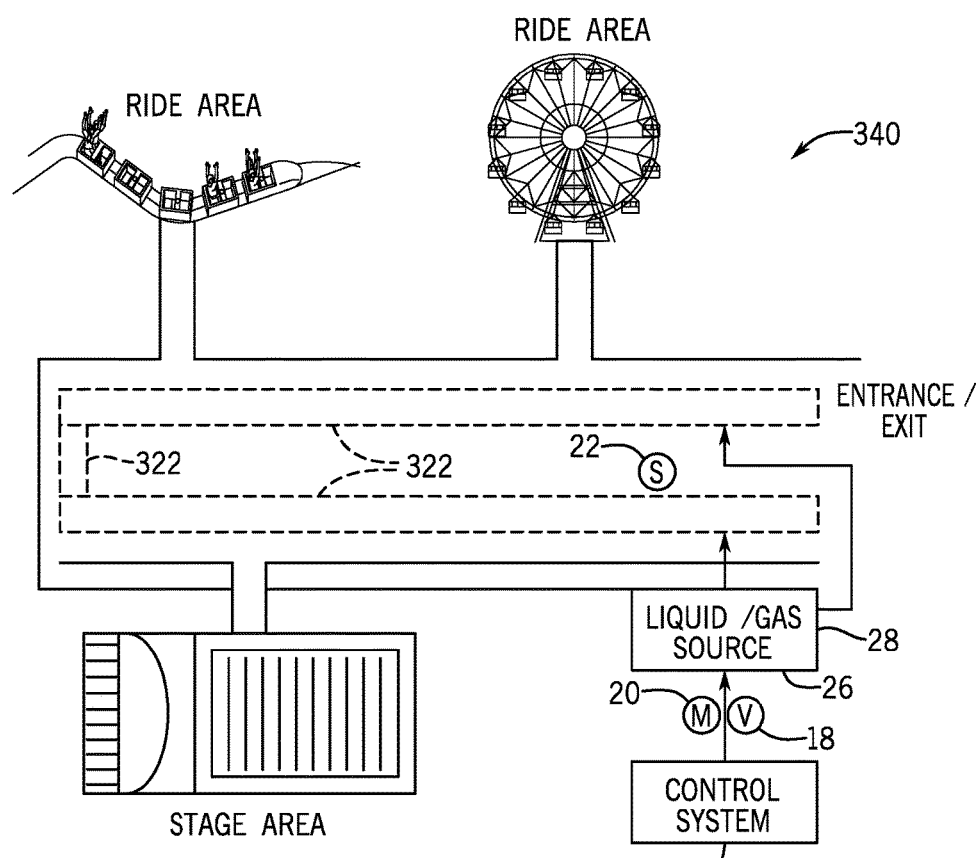
FIG. 29 illustrates a diagram of an amusement park environment with inflatable walls, in accordance with embodiments described herein.

By way of example, FIG. 29 illustrates an amusement park environment 340 with different areas. In some embodiments, the inflatable walls 322 may be disposed under walkways or adjacent to entrances to the different areas. If the control system 40 receives a command or signal requesting that access to a particular area of the amusement park environment 340 be restricted, the control system 40 may inflate the inflatable walls 322 to deny guests access to the different areas. In this way, the control system 40 may coordinate the removal of guests from the amusement park environment 340, while preventing the guests from entering restricted areas.

In the same manner, inflatable doors and entryways may be inflated and deflated via the control system to provide access and deny access to different parts of an amusement park ride or exhibit. The inflatable doors, entryways, and walls may be tailored with the inflatable material to display various contours and features that change over time when the inflatable material is inflated or deflated, when gas directing mechanisms within the inflatable material are adjusted, and the like. In one embodiment, in an exhibit or during a ride, the inflatable door may appear (e.g., inflate from ground or side) and disappear (e.g., deflate) to provide access to a different part of the exhibit or ride. In another embodiment, the doors or other obstacles may curl away from a path as the user traverses the path.

In certain situations, organic shapes may be inflated within the amusement park environment 340 to direct the guests to exits. In addition, inflatable objects 12 may be used to generate signs or text to indicate a direction for guests to travel in the amusement park environment 340. In one embodiment, the inflatable objects 12 may be used to create arrow shapes to indicate a direction to travel. The inflatable objects 12 may also move a hand or arm feature of a character to indicate a direction to travel within the amusement park environment 340.

In addition, some exhibits within the amusement park environment may include scenery or background effects that change based on different arrangements of inflatable objects 12 that are inflated. That is, certain inflatable objects 12 used to represent certain objects for a scene on a stage may project from the wall or floor of an exhibit for a portion of a show, while other scene objects may project from the wall or floor during a second portion of a show. For example, in certain exhibits or a scene on a stage, an inflatable object may correspond to a tree-like figure that includes branches made up of inflatable tubes. In some embodiments, the tree-like figures may include gas directing mechanisms (e.g., valves, mechanical system) that cause the branches to embrace guests, physically touch guests, and move in various positions based on detected positions and/or motions of guests. In the same manner, other types of figures may be erected using the IPS 10 described herein.

Some exhibits may include scenery or background effects that change based on different arrangements of inflatable materials that are inflated. That is, certain scene objects may project from the wall or floor of an exhibit for a portion of a show, while other scene objects may project from the wall or floor during a second portion of the show.

A certain exhibit may include a tree-like figure that includes branches made up of inflatable tubes that include gas directing mechanisms that cause the branches to embrace guests, push guests, and move in various positions based on detected positions and/or motions of guests. In the same manner, other types of figures may be erected using the pneumatic robots described herein.

Customizing Amusement Park Attractions Using Inflatable Objects

As discussed above, the IPS 10 may be employed in an amusement park environment to enhance a user's experience while participating in an amusement park attraction (e.g., ride). In some embodiments, the IPS 10 may be integrated into an amusement park ride or exhibit to customize a user's experience based on a desired speed, a user's height, a user's weight, a desired level of force during the ride, and the like. For example, a particular amusement ride (e.g., a slide) may be tailored for an individual rider based on desired speeds of the user. That is, the ride may adjust for each individual rider to achieve a faster speed or a slower speed based on a request of the user. Specifically, in operation, the IPS 10 may increase or decrease certain inclines which riders may experience during the ride by inflating or deflating certain inflatable structures or items that may be integrated into the ride.

Figure 30:
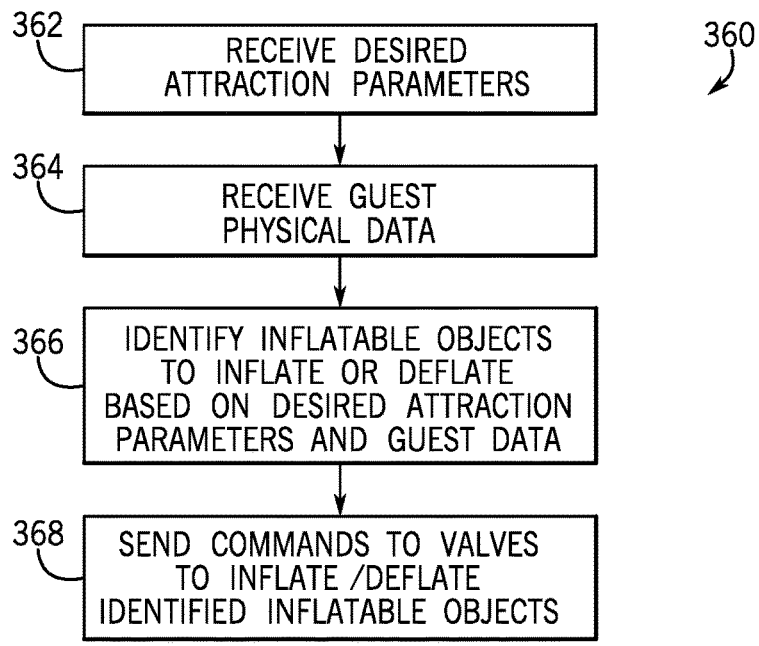
FIG. 30 illustrates a flow chart of a method for inflating inflatable objects in an amusement park exhibit using the inflatable pneumatic system, in accordance with embodiments described herein.

With the foregoing in mind, FIG. 30 illustrates an example flow chart of a method 360 for adjusting certain parameters of an amusement park exhibit or ride based on data related to a user. Although the following description of the method 360 is described as being performed by the control system 40, it should be noted that any suitable computing device may perform the process described herein.

Referring now to FIG. 30, at block 362, the control system 40 may receive a set of data related to a user's desired parameters for a certain attraction. The parameters of an attraction may include an amount of desired force to experience during the course of a ride, a desired maximum speed experienced during the course of a ride, a maximum level of acceleration experienced during a ride, and the like. In some embodiments, the user may provide desired parameters at a computing system associated with operating the attraction or ride, and the desired parameters may then be communicated to the control system 40. In one embodiment, numerous parameters may be associated with a single value for an intensity level of the ride (e.g., a rate from 1 to 10).

In addition, a user may define a list of parameters for each individual exhibit at an amusement park or provide a general desired experience parameter (e.g., slow, medium, fast) for a collection of exhibits at the amusement park. The list of parameters may be stored in a memory medium or an electronic device, such as a smart phone, which may transfer the parameter data to the control system 40. In certain embodiments, the parameter data may be stored in a passive electronic device such as an RFID tag. As such, the control system 40 may retrieve the data related to the desired parameters via the sensors 22 or the like.

In addition to desired parameter data, at block 364, the control system 40 may receive guest physical data, which may include details related to physical features of the user. For example, the guest physical data may include a height, a width, and weight of the user. In some embodiments, the guest physical data may include a body scan of the user that details the contours and shape of the user's body. The guest physical data may be used by the control system 40 to adjust various inflatable objects 12 associated with various amusement park exhibits to secure the user to each respective exhibit in a comfortable manner by accounting for the user's physical features. Like the desired attraction parameters described above, the guest physical data may be provided to the control system 40 via a computing system associated with each respective attraction, via a memory component or computing device associated with the user, a passive electronic device associated with the user, or the like.

At block 366, the control system 40 may identify inflatable objects 12 of a respective amusement park attraction that should be inflated or deflated based on the parameter data and/or the guest physical data described above. That is, depending on the particular attraction, the control system 40 may accommodate the user's desired attraction parameters with respect to the user's physical data by modifying the inflation level, pressure, or state of various inflatable objects 12 that may be incorporated into the respective attraction. Various example attractions in which the inflatable objects 12 may be adjusted based on the desired attraction parameters and/or guest physical data is discussed below with reference to FIGS. 31-43.

After identifying the inflatable objects 12 and determining an appropriate pressure or inflation level for each of the identified inflatable objects 12, the control system 40 may, at block 368, send one or more commands to the valves 18 or to a controller associated with the valves 18. The commands may cause the valves 18 to fluidly connect or disconnect the fluid source (e.g., liquid source 26/gas source 28) to the respective inflatable objects 12. The control system 40 may receive feedback from sensors 22 or the meters 20 to determine whether each respective inflatable object 12 has been inflated to a determined level. After determining that the inflatable objects 12 are inflated to the determined levels, the control system 40 may send commands to the valves 18 or the associated controllers to disconnect the fluid source from the inflatable objects 12.

Figure 31:
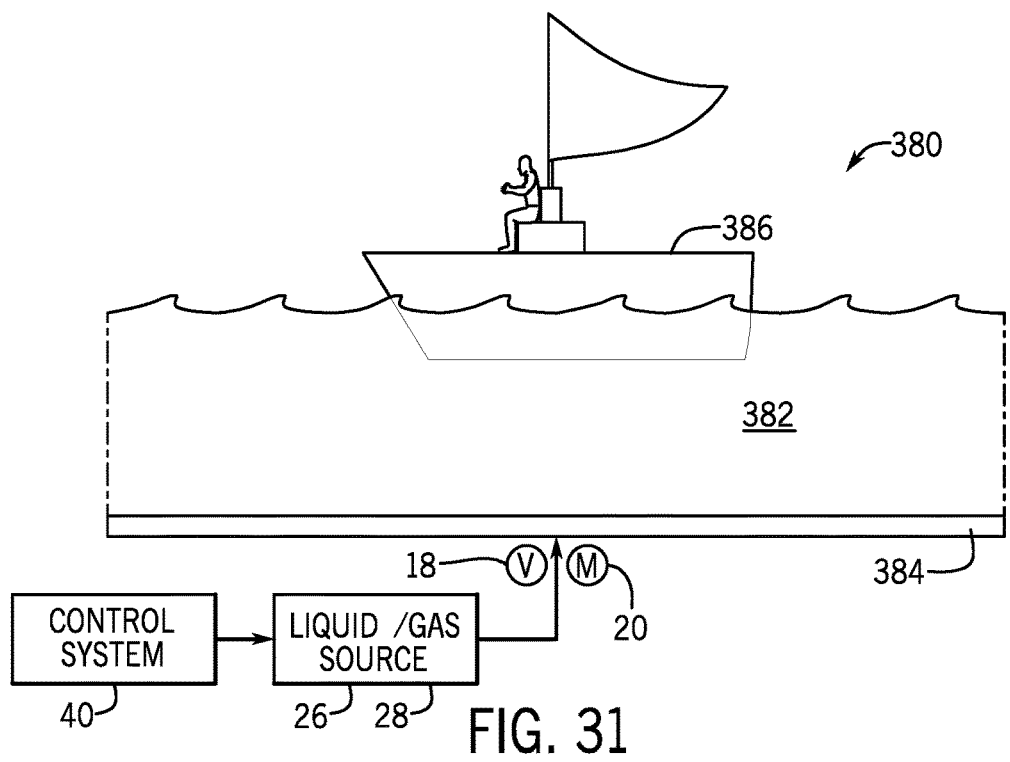
FIG. 31 illustrates a diagram of an amusement water park environment using the inflatable pneumatic system, in accordance with embodiments described herein.
Figure 32:
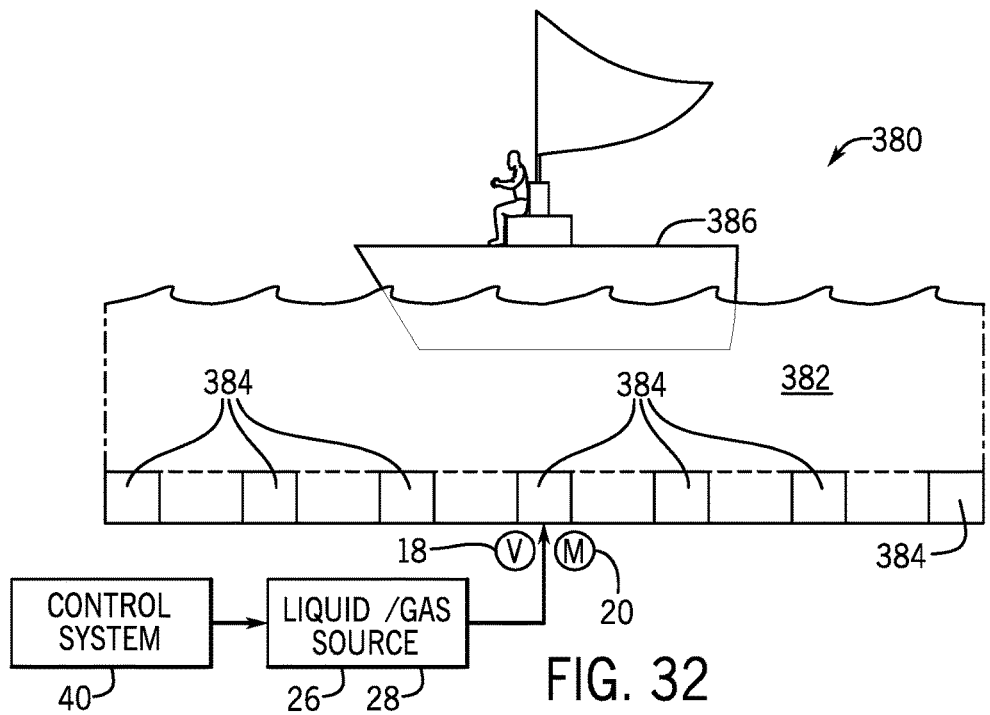
FIG. 32 illustrates a diagram of an amusement water park environment using the inflatable pneumatic system, in accordance with embodiments described herein.
Figure 33:
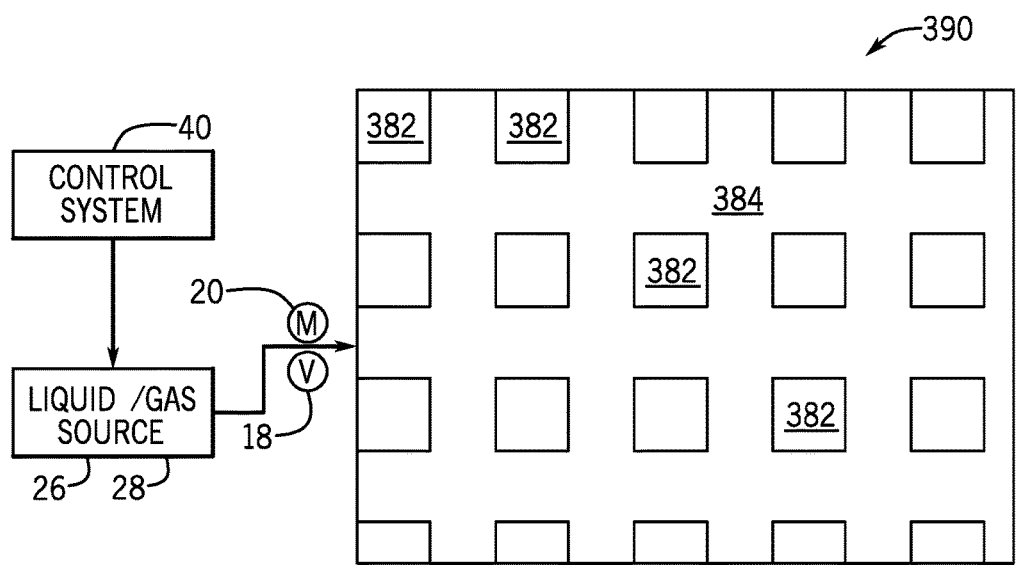
FIG. 33 illustrates a diagram of an amusement water park environment using the inflatable pneumatic system, in accordance with embodiments described herein.

With the foregoing in mind, FIGS. 31, 32, and 33 illustrate how a water ride attraction may use inflatable patterns to adjust certain parameters of the water ride attraction in accordance with the method 360 described above. FIG. 31 illustrates a side view 380 of a water ride attraction that may include a body of water 382 and an inflatable grid structure 384. The body of water 382 may include a channel of water in which a watercraft 386 or other suitable floating vehicle may traverse. The inflatable grid structure 384 is depicted as deflated in FIG. 31 and thus provides little friction with respect to the flow of the water 382. As such, the watercraft 386 may traverse the body of water 382 at a certain speed depending on a force in which the watercraft 386 entered the body of water 382.

Referring back to the method 360 of FIG. 30, if the desired attraction parameter indicated a maximum speed or force value that exceeds the expected speed or forces exerted on the watercraft 386 based on the properties of the water ride attraction and the guest physical data, the control system 40 may inflate the inflatable grid structure 384 to cause the water 382 to become more shallow and provide more friction with respect to the flow of the water 382. That is, the control system 40 may send a command to the valve 18 to open and fluidly couple the fluid source to the inflatable grid structure 384.

FIG. 32 illustrates the side view 380 of the water ride attraction with the inflatable grid structure inflated. As shown in FIG. 32, when the inflatable grid structure 384 is in an inflated state, the water 382 becomes more shallow, as compared to when the inflatable grid structure 384 is deflated. As a result, the watercraft 386 may traverse the water 382 at a reduced speed, as compared to when the inflatable grid structure 384 is deflated.

The inflatable grid structure 384 may form a grid pattern, which may increase an amount of friction against the flow of the water 382. FIG. 33 illustrates a top view 390 of the inflatable grid structure 384 when inflated. The pattern and the reduced depth of the water 382 may cause the watercraft 386 to traverse the water at a slower speed.

In some embodiments, the control system 40 may adjust the height or pressure of the inflatable grid structure 384 or other suitable inflatable object 12 based on the desired attraction parameters and guest physical data. For instance, if the user's preference is for a medium level of speed or force, the control system 40 may inflate the inflatable grid structure 384 to approximately half of its maximum rating. As such, the watercraft 386 may traverse the water 382 faster than if the inflatable grid structure 384 was fully inflated, yet slower than if the inflatable grid structure 384 was fully deflated.

Although the inflatable grid structure 384 is depicted as having a grid pattern, it should be noted that the water ride attraction may use other types of inflatable objects 12 to adjust the flow of the water 382. For example, the water ride attraction may include a number of inflatable obstacles that may be positioned at various locations within the water 382 without regard to any particular pattern.

Figure 34:
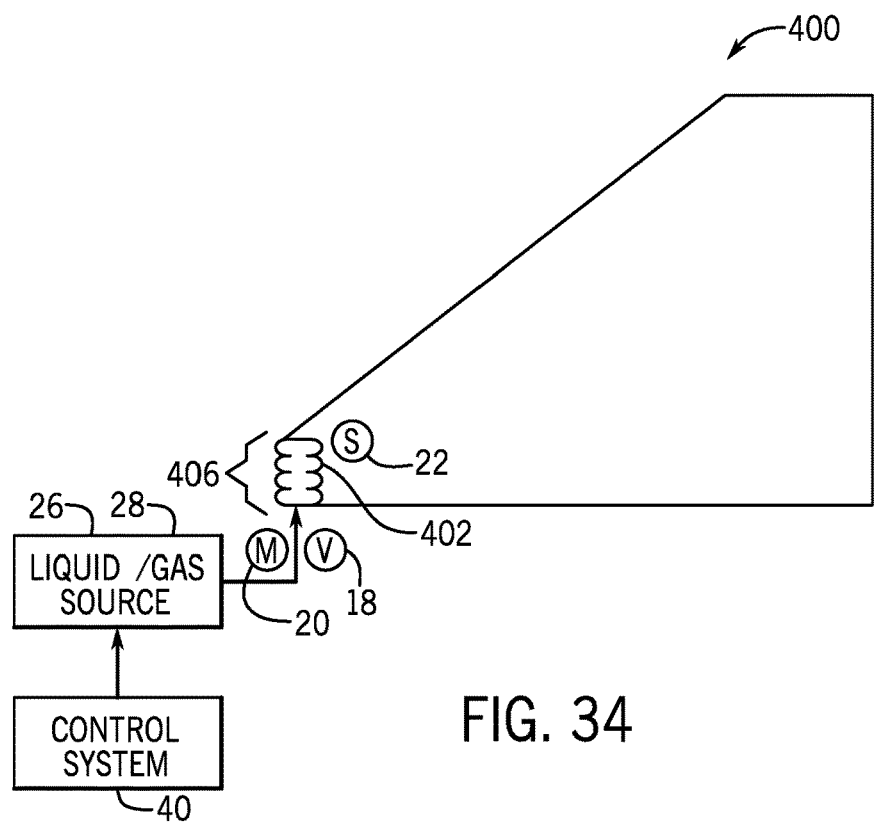
FIG. 34 illustrates a diagram of a slide feature using the inflatable pneumatic system, in accordance with embodiments described herein.
Figure 35:
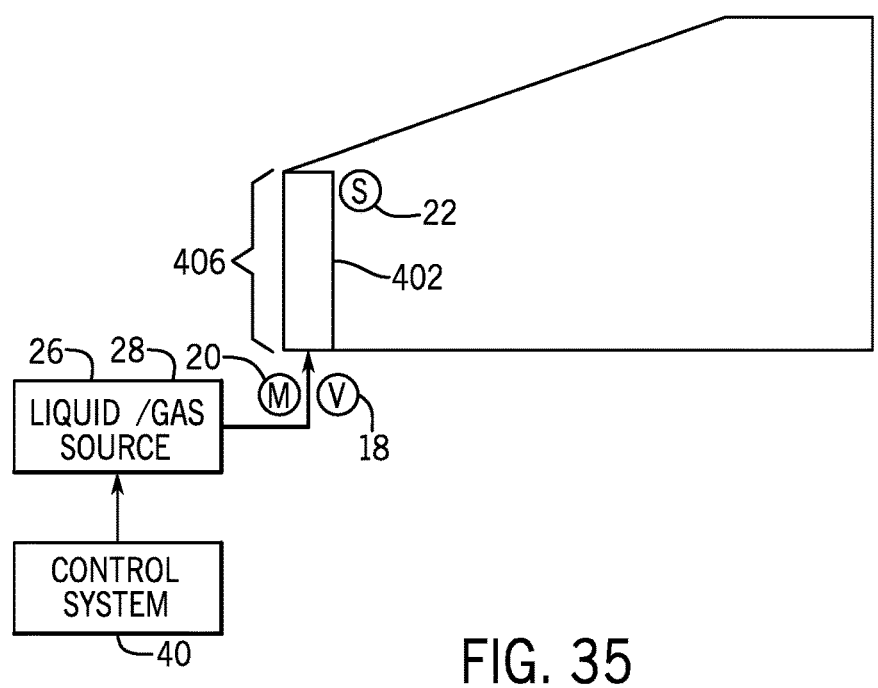
FIG. 35 illustrates a diagram of a slide feature using the inflatable pneumatic system, in accordance with embodiments described herein.

In addition to adjusting a water flow, the present embodiments described herein may include adjusting the incline of a slide feature of a water park ride. That is, a slide feature may have a steeper incline for one user and a less steep incline for another user. For example, FIGS. 34 and 35 illustrate an example embodiment in which a slope of a slide feature 400 may be adjusted using an inflatable jack 402. By way of example, based on the desired attraction parameters and the guest physical data, the control system 40 may determine a slope value for the slide feature 400. The inflatable jack 402 may be positioned at either end of a slide, at positions along the slide, or multiple inflatable jacks may be positioned at various locations (e.g., at each end).

In one embodiment, the control system 40 may use the inflatable jack 402 as a lifting mechanism to raise or lower an end portion of the slide feature 400, thereby decreasing or increasing the slope of the slide feature 400. Referring back to FIG. 30, after receiving the desired attraction parameters (e.g., maximum speed) and the guest physical data, the control system 40 may determine an angle or slope for the slide feature 400 to allow the respective guest to have an experience that matches his desired parameters. For example, the control system 40 may determine the desired slope of the slide feature 400 to achieve a desired or maximum speed while the guest traverses the slide based on the weight of the guest.

With this in mind, the control system 40 may send a signal or command to the valve 18 to fluidly connect the fluid source to the inflatable object 12, thereby inflating the inflatable jack 402. As shown in FIG. 34, when the inflatable jack 402 is deflated or includes less fluid than when it is fully inflated, as depicted in FIG. 35, the slide feature 400 has a steeper or higher incline, as compared to when the inflatable jack 402 includes more fluid. As such, the pressure or amount of fluid stored in the inflatable jack 402 may directly correspond to an expected speed in which a guest may traverse the slide feature 400.

In certain embodiments, the inflatable jack 402 may be incorporated into a side 406 of the slide feature 400 via a coupling feature (e.g., tubing sewn into slide feature 400). The slide feature 400 may also be made up of an inflatable material and filled with a fluid. To increase the deflation process of the inflatable jack 402, a suction pump or other suitable device may pull the fluid out of the inflatable jack 402.

Figure 36:
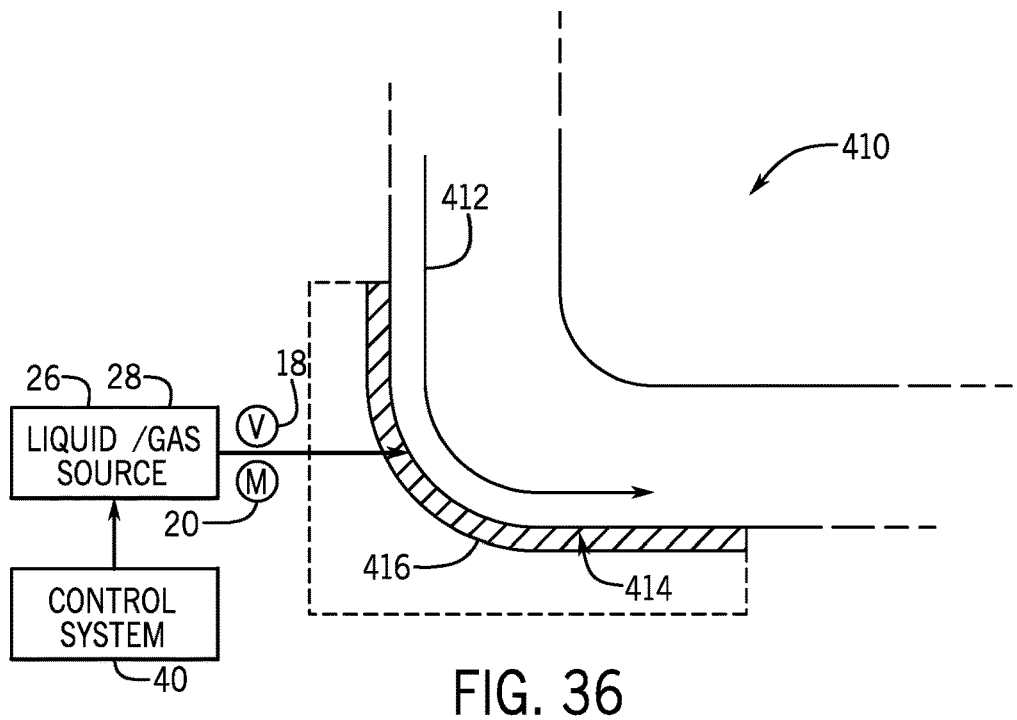
FIG. 36 illustrates a diagram of a turn feature in an amusement park exhibit using the inflatable pneumatic system, in accordance with embodiments described herein.
Figure 37:
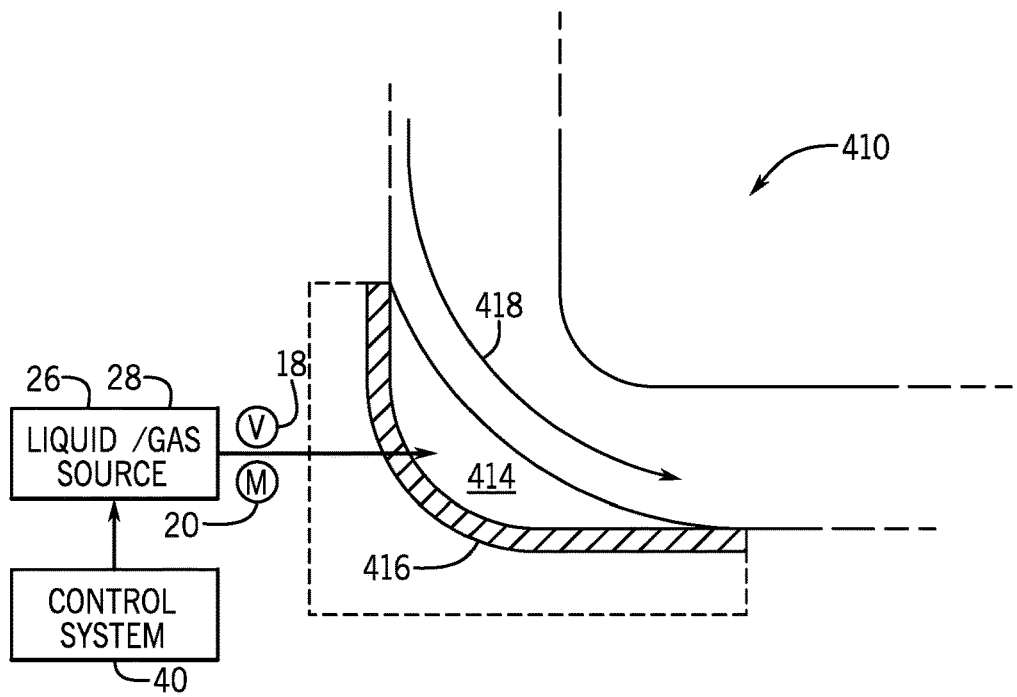
FIG. 37 illustrates a diagram of a turn feature in an amusement park exhibit using the inflatable pneumatic system, in accordance with embodiments described herein.

In addition to controlling the slope of the slide feature 400, the control system 40 may control a speed or amount of force exerted on a guest in certain amusement park attractions with certain turn features. By way of example, FIGS. 36 and 37 illustrate a top view of a turn feature 410 of an attraction. The turn feature may include a turn that a guest traverses during a water slide attraction, a roller coaster attraction, a dry slide attraction, or the like. In any case, the turn feature 410 may include an expected path 412 that a guest may traverse when encountering the turn feature 410 during the attraction. As shown in FIG. 36, the turn feature 410 may cause the expected path 412 to include an approximately 90 degree turn. While turning on the turn feature 410, the guest may experience a certain amount of force that may induce a certain amount of excitement or emotion.

Referring briefly back to the method 360 of FIG. 30, the guest may control the level of excitement or force that he experiences by providing desired attraction parameters. With this in mind, an inflatable bumper 414 stored in a cavity 416 positioned along the turn of the turn feature 410 may be used to adjust the speed or force that the guest experiences while traversing the turn feature 410. That is, if the control system 40 receives desired attraction parameters that indicates that the guest requests a certain maximum force that is less than the force exerted on the guest while traveling through the turn feature 410, the control system 40 may send a signal or command to the valve 18 to fluidly connect the fluid source to the inflatable bumper 414.

When inflated, the inflatable bumper may adjust the turning angle that the guest experiences during the attraction. As shown in FIG. 37, inflating the inflatable bumper 414 may cause a radius of a curvature in the turn feature 410 to increase as compared to the radius of the curvature depicted in FIG. 36. As a result, an expected path 418 of the guest may include a less dramatic turn and thus the guest may experience less forces, as compared to traversing the expected path 412.

As discussed above with respect to other embodiments, the inflatable bumper 414 may also be coupled to a suction pump or similar type of device to pull the fluid out from the inflatable bumper 414. In addition, mechanical motors or the like may be coupled to ropes or ties attached to various points of the inflatable bumper 414 to pull the material that makes up the inflatable bumper 414 into the cavity 416. In some embodiments, the cavity may include a door mechanism that opens outward towards the curvature of the slide feature 400, thereby allowing the inflatable bumper 414 to form. After the inflatable bumper 414 is retracted back into the cavity 416, the door mechanism may close and may stay in a position that prevents it from bending toward the cavity 416. As such, the door mechanism may provide a surface material for the guest to traverse when the inflatable bumper 414 is not present and yet allow the inflatable bumper 414 to exit from the cavity 416.

In certain embodiments, multiple inflatable bumpers 414 may be stored in the cavity 416, such that depending on the desired attraction parameters and the guest physical data, the control system 40 may inflate a particular inflatable bumper 414 to meet the expectations of the guest. Each different inflatable bumper 414 may provide a different radius for the curvature of the turn feature 410. Using the various radii of the curvatures available in the inflatable bumpers 414, the desired attraction parameters, and the guest physical data, the control system 40 may determine which of the inflatable bumpers 414 causes the guest to experience his desired attraction parameters. The control system 40 may then cause the appropriate inflatable bumper 414 to inflate.

In addition to controlling certain parameters of an attraction, the IPS 10 may be used to create a unique experience or define how a certain attraction may operate. That is, a user may design certain features (e.g., slides, turns, heights) of a ride using the control system 40 or other suitable device. After receiving the desired features, the control system 40 may inflate and adjust fluid directing mechanisms of various inflatable objects 12 to form the ride designed by the user.

Figure 38:
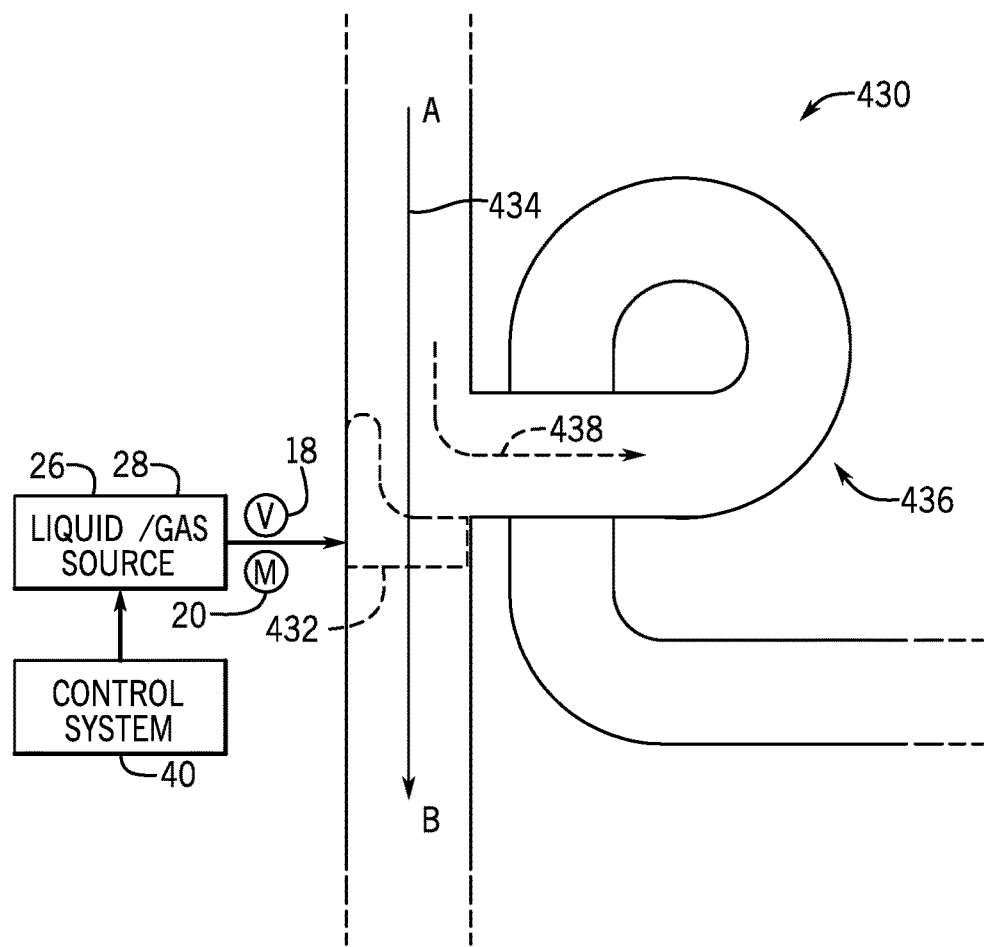
FIG. 38 illustrates a top view of a turn feature in an amusement park exhibit using the inflatable pneumatic system, in accordance with embodiments described herein.

With the foregoing in mind, FIG. 38 illustrates a top view of an attraction (e.g., water slide, dry slide, vehicle ride) pathway 430 that may be adjusted using an inflatable path director 432. As shown in FIG. 38, a first pathway 434 may include traveling from region A to region B by proceeding along a relatively straight line. In some embodiments, the control system 40 may receive an indication (e.g., desired attraction parameters) that the guest desires to experience a loop feature 436 in the attraction pathway 430. To provide the guest with the requested experience, the control system may send a signal or command to the valve 18 or other suitable device to fluidly connect the fluid source to the inflatable path director 432.

After the inflatable path director 432 is inflated, the first pathway 434 may become blocked and the guest may be diverted to second pathway 438. Like the inflatable bumper 414 described above, the inflatable path director 432 may be stored in a cavity and may create a curvature in the middle of the first pathway 434 that diverts guests or vehicles traversing the first pathway 434. As a result, the guest may experience the loop feature 436 of the attraction.

In certain embodiments, an amusement attraction may include a number of inflatable path directors 432, inflatable walls 322, and other inflatable objects 12 as described herein embedded into the floor of an exhibit. The control system 40 may provide a number of designs for a course of the attraction via an electronic display or the like. A guest may specify to the control system 40 a particular design or may select a portion of the inflatable objects 12 embedded into the floor to inflate. In this way, the guest may design his own course or pathway for an attraction, may build his own maze structure in an attraction, control slide and turn velocities of an attraction, and the like. In certain embodiments, the guest may access the designs or the available inflatable objects 12 of an attraction via the Internet or via a local network. The guest may then select one or more designs for one or more attractions or create a unique design for an attraction based on the available inflatable objects 12. In any case, the selected or created design may be stored in a cloud storage system or any other suitable memory medium (e.g., RFID tag), such that the control system 40 may automatically implement the respective design for a respective attraction in response to receiving an indication of the respective design via the sensors 22, a communication link with the cloud storage system, communication with an electronic device (e.g., smartphone), or the like. That is, the control system 40 may adjust the states of various inflatable objects 12 based on a design selected or designed by a user at an earlier time. As a result, the user may enhance his experience with various attractions at the amusement park by designing his attraction experience well in advance of his trip to the amusement park. The designs may be rated by other guests via a website or other suitable medium that allows different users to rate the various designs of different attractions modified using inflatable objects 12.

In addition to embedding inflatable objects 12 into the floor to adjust an operation of an attraction, inflatable objects 12 may also be embedded into the floor to provide targets for guests in a shooting gallery exhibit. The control system 40 may, in some embodiments, control the speed in which certain targets are inflated based on a desired level of difficulty. That is, if a user specifies (e.g., desired attraction parameters) a relatively high difficulty level, the control system 40 may inflate a number of the inflatable objects 12 using a high-pressure fluid source to create inflatable targets at a certain rate. If the user specifies (e.g., desired attraction parameters) a relatively low difficulty level, the control system 40 may inflate a number of the inflatable objects 12 using a lower-pressure fluid source to create inflatable targets at a rate slower than the higher difficulty rate. In addition, the control system 40 may inflate more targets for a higher difficulty rate, as compared to a lower difficulty rate.

In some embodiments, the guest may specify certain features of a funhouse or maze exhibit. For example, FIGS. 39 and 40 illustrate a room environment 460 that has an inflatable ceiling 462. The inflatable ceiling 462 may be coupled to a coupling feature 464 via a wire or line 466. The line 466 may include a tension force that causes the inflatable ceiling 462 to retract to the ceiling 468 of the room environment 460. If the guest provides a request, to the control system 40, to make the ceiling 468 taper down or shrink, the control system 40 may send a signal or command to the valve 18 to fluidly couple the fluid source to the inflatable ceiling 462, which may be made to have a triangular shape that decreases the ceiling height across the room environment 460, as shown in FIG. 40.

Figure 41:
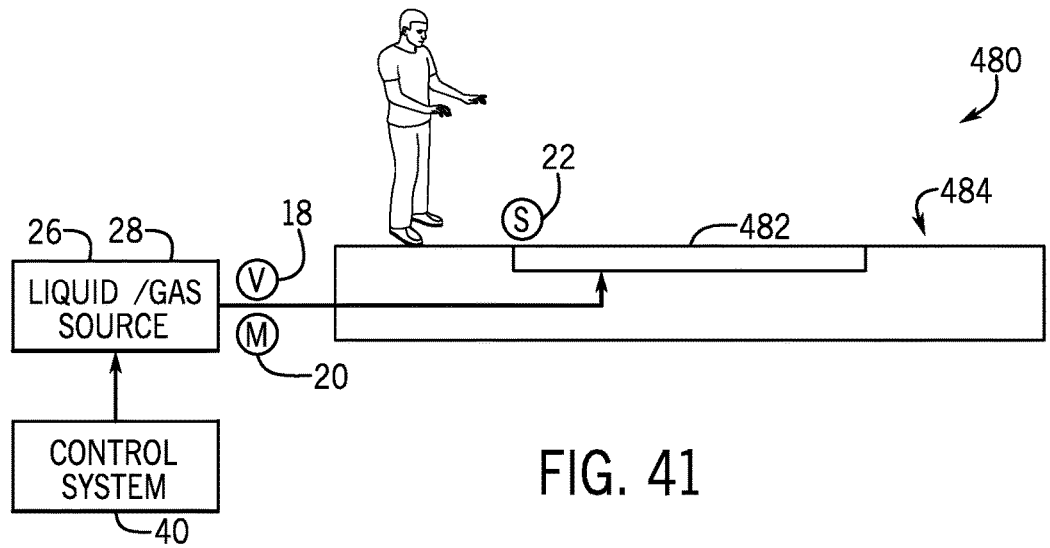
FIG. 41 illustrates a diagram of a room environment with a floor feature using the inflatable pneumatic system, in accordance with embodiments described herein.
Figure 42:
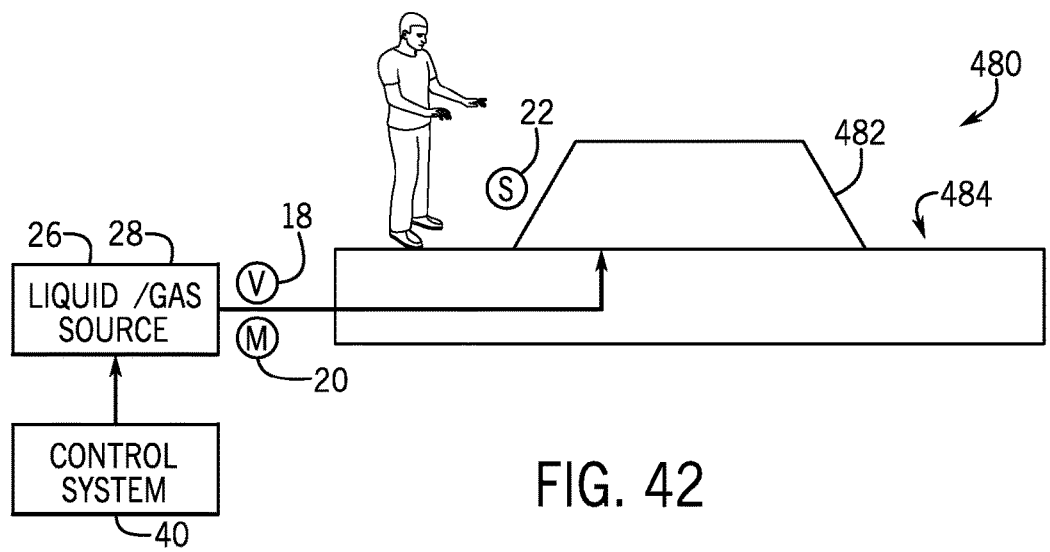
FIG. 42 illustrates a diagram of a room environment with a floor feature using the inflatable pneumatic system, in accordance with embodiments described herein.

In the same manner, the guest may specify how a terrain or floor of a room environment changes via instructions to the control system 40. For instance, FIGS. 41 and 42 illustrate a room environment 480 that includes an inflatable flooring feature 482 that may adjust a structure of a floor 484. As shown in FIG. 42, the control system 40 may inflate the inflatable flooring feature 482, which may form a trapezoidal shape that the guest may then traverse in the room environment 480. Although the foregoing ceiling features and the flooring features are depicted as forming a triangular and trapezoidal shape, it should be understood that these inflatable features may be molded to form any suitable shape. Indeed, a variety of shapes and types of designs for the ceiling features and the flooring features may be presented to the guest when the guest is in the process of designing her respective exhibit experience.

It should also be noted that the various embodiments, in which inflatable objects adjust an exhibit experience, described above may be incorporated into the virtual reality environment 280 described above. That is, the IPS 10 may coordinate the inflation and deflation of various features of a room to coordinate with the virtual environment presented to the guest via the virtual reality system 282.

In addition to customizing exhibit experiences, the IPS 10 may be used in amusement ride seating to adjust the height, width, restraints, or other features of the seating to accommodate the individual guest. For instance, the inflatable objects 12 may be positioned at various locations with respect to a ride's seat to accommodate the ride's physical specifications for the guest. That is, the inflatable objects 12 may be filled with fluid to accommodate each individual guest to ensure that the guest is nestled in the seat for the duration of the ride.

With regard to incorporating inflatable objects 12 into amusement park ride seats, in some embodiments, the control system 40 may inflate the inflatable objects 12 disposed in the seats or in restraints used to keep a guest secure in the seat to adjust certain properties of the seat or restraints. For instance, the control system 40 may inflate the inflatable object 12 positioned at the bottom of a seat to adjust the seat's height based on the guest physical data and parameters (e.g., expected forces) of the amusement park ride. As briefly mentioned above, in one embodiment, a digital scan or similar sensed identification of the physical properties of the guest may be acquired before entering the ride and the seat may automatically adjust based on the guest physical data received by the control system 40. In another embodiment, the control system 40 may adjust the inflatable objects 12 within the seat to fit or nestle the guest based on the weight and dimensions of the guest. Sensors 22 may be disposed on the seat or on the vehicle carrying the guest through the amusement park exhibit to provide feedback with regard to whether additional space is available between the inflated inflatable object 12 and the guest when the guest is seated in the seat.

The control system 40 may also receive data from the sensors 22 or the like concerning other characteristics of the guest positioned in the seat. For instance, data may be provided to the control system 40 to indicate positions of the feet of the guest while seated, the position of the guest's head while seated, and the like. This data may be received via the sensors 22, as described above which may include image sensors (e.g., camera), weight sensors, light sensors, proximity sensors, and other suitable devices.

In addition to embedding the inflatable objects 12 into the seats, the present embodiments use the inflatable objects 12 as a restraint to secure the guest in his seat. For example, the inflatable objects may be positioned within the seat as a safety belt and inflated to secure the guest within the seat. In addition, the inflatable objects 12 of the seat or restraints may be inflated or deflated during various portions of the ride. That is, depending on the expected speed/force of the moving vehicle, the desired attraction parameters, and the guest physical data, for example, the control system 40 may inflate or deflate the inflatable objects 12 to counteract various forces experienced by the guest during the ride to provide a more comfortable experience for the guest.

Figure 43:
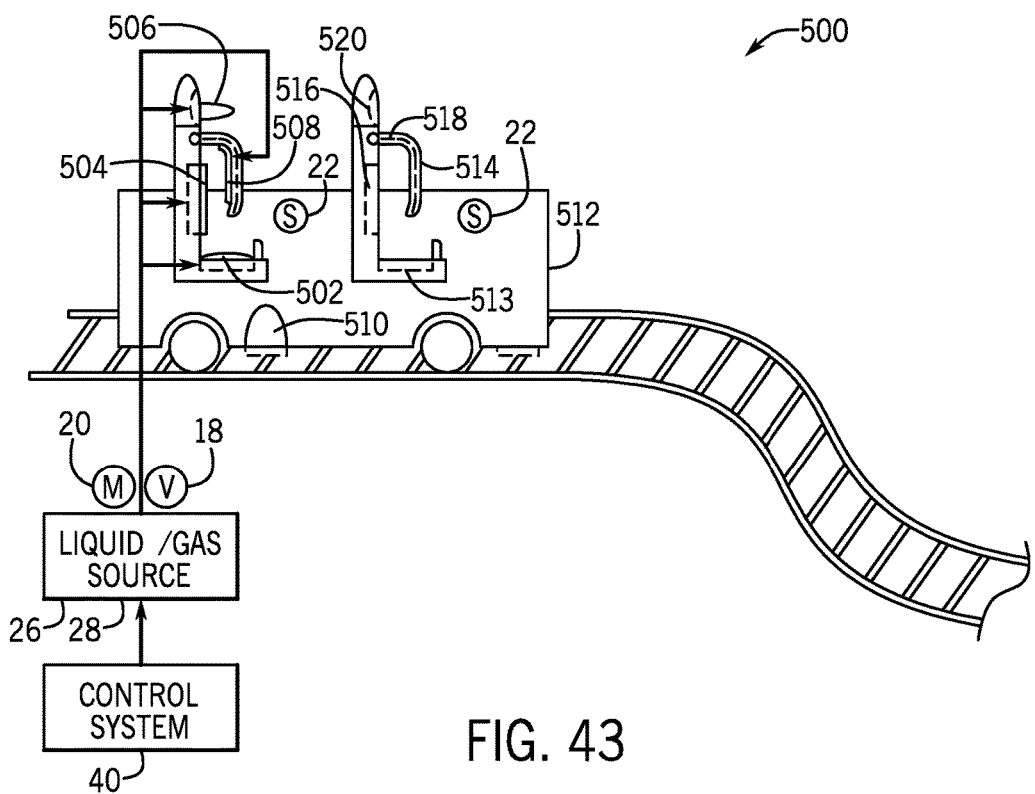
FIG. 43 illustrates a diagram of an amusement park ride system using the inflatable pneumatic system, in accordance with embodiments described herein.

Keeping the forgoing in mind, FIG. 43 illustrates an example amusement park ride system 500 that includes inflatable seat adjusters 502, inflatable back supports 504, inflatable head rests 506, inflatable restraint supports 508, and inflatable step stools 510 incorporated into an amusement park car 512 (e.g., ride vehicle cabin). Referring to FIG. 43, the car 512 may include a fluid source (e.g., liquid source 26, gas source 28) to provide fluid to various inflatables positioned within the car 512.

By way of example, the inflatable seat adjuster 502 may be positioned on a seat where a guest may rest while seated. To compensate for the lack of height of a guest, the control system 40 may inflate the inflatable seat adjuster 502 via the valve 18 and the fluid source. The inflatable seat adjuster 502 may be stored in a cavity 513 within the seat. As the inflatable seat adjuster 502 inflates, the inflatable seat adjuster 502 may exit the cavity 513 and help to raise a position of the head of a seated guest to enable him to be positioned properly for a restraint 514 to secure the guest to the seat during the ride.

In addition, to compensate for a lack of torso depth of a guest, the control system 40 may inflate the inflatable back support 504 to push the seated guest towards the restraint 514. Like the inflatable seat adjuster 502, the inflatable back support 504 may be stored in a cavity 516. In the same manner, the inflatable restraint supports 508 may be stored inside a cavity 518 within the restraints 514. Is some embodiments, the control system 40 may inflate the inflatable back support 504 and the inflatable restraint supports 508 to secure the guest between the back of the seat and the inside of the restraint 514 and, in some embodiments, in conjunction with the type of experience guests request based on input gathered prior to or during the ride.

In some embodiments, the car 512 may include the inflatable step stool 510 positioned on the floor of the car 512 in front of the seat. The inflatable step stool 510 may be inflated to accommodate the guest's feet if they do not reach the floor of the car 512. In addition, the inflatable step stool 510 may be inflated to assist a guest to reach or access the seat of the car 512.

The inflatable head rests 506 may be stored in a cavity 520 and may be inflated to extend out from the back of the head rest of the seat and/or out to the sides of the guest's head when seated. In some embodiments, the inflatable head rests 506 may be inflated to secure the guest's head during the course of the ride. In addition, the inflatable head rests 506 may be inflated at a particular side of the guest's head to compensate for certain forces exerted on the guest during the ride. Referring briefly back to the method 360 of FIG. 30, the desired attraction parameters may include a desired force or comfort level during the ride experience. Using this data, the control system 40 may adjust the inflation levels of the inflatable seat adjusters 502, the inflatable back supports 504, the inflatable head rests 506, and the inflatable restraint supports 508 to compensate for different forces exerted on the guest during the course of the ride.

In addition, inflatable slides or structures (e.g., ladders) may also be embedded in the car 512 to enable guests to exit different portions of the ride that may be positioned off of the ground or in places that may be difficult to reach by traditional ladders and the like. As such, stuck cars may have an ability to provide the guest rider a means to exit the car 512 and reach the ground.

With the forgoing in mind, in some embodiments, the various types of inflatable objects 12 described may be inflated during the course of a ride or an exhibit to create obstacles for the ride or user during the user experience. In the same way, the inflatable objects 12 may deflate, such that obstacles are removed during the course of a ride or exhibit. The inflatable objects 12 may also inflate and deflate to different pressure levels to form an object having a hard surface to one having varying degrees of a soft or amorphous surface. As mentioned above with regard to the balloons, different portions of the inflatable objects 12 may be inflated or gas deflecting mechanisms may be controlled while gas is pumped into the material to make the resulting formation move, change shapes, and the like.

Enhancing Amusement Park Attractions Using Inflatable Objects

In addition to the embodiments described above, the inflatable objects 12 described herein may be placed in a variety of amusement park attractions to perform additional functions such as assisting vehicles to propel in a certain direction, providing a means to halt an amusement park ride, and the like. By way of example, certain amusement park rides may include ride vehicle cabins with inflatable objects 12 disposed within the surface of the cabins to assist the vehicle if it becomes immobile or stuck against another object. That is, upon detecting that the vehicle is not moving in an expected fashion, the control system 40 may inflate a particular inflatable object 12 to push the vehicle against an object that may be obstructing its motion.

Figure 44:
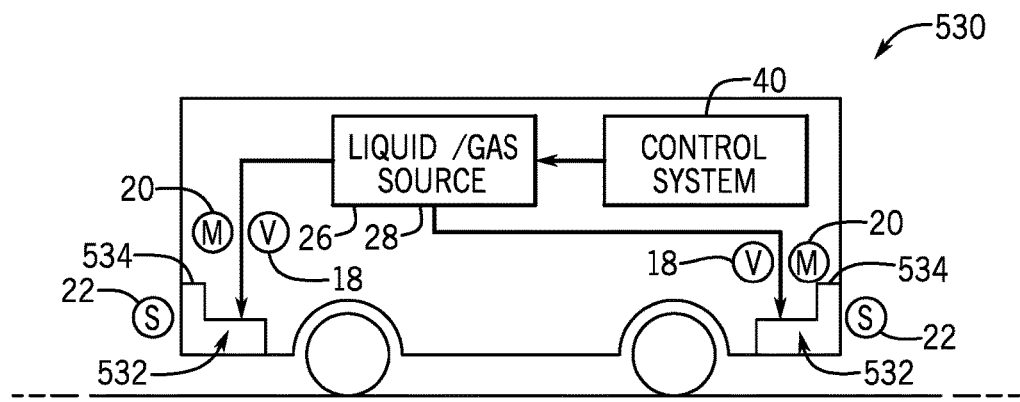
FIG. 44 illustrates a diagram of an amusement park ride system using the inflatable pneumatic system to overcome an obstacle, in accordance with embodiments described herein.
Figure 45:
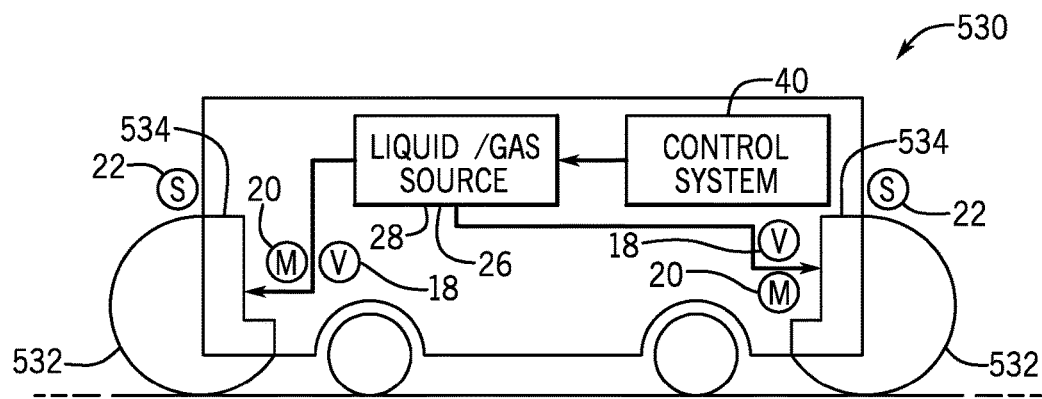
FIG. 45 illustrates a diagram of an amusement park ride system using the inflatable pneumatic system to overcome an obstacle, in accordance with embodiments described herein.

Keeping this in mind, FIGS. 44 and 45 illustrate a ride vehicle 530 that has a number of inflatable bumpers 532 that project from cavities 534 within the ride vehicle 530. In some embodiments, the inflatable bumpers 532 may be positioned around the perimeter of the ride vehicle 530. Although FIGS. 44 and 45 illustrate the inflatable bumpers 532 positioned at the bottom of the ride vehicle 530, it should be noted that the inflatable bumpers 532 may be positioned in any suitable location on the ride vehicle 530.

As shown in FIGS. 44 and 45, the ride vehicle 530 may include a number of sensors 22 that may detect whether any object or obstruction is positioned in front or behind the ride vehicle 530. In some embodiments, the control system 40 may determine whether the ride vehicle 530 is immobilized due to an obstruction or the like via data acquired by the sensors 22. In one example, the sensors 22 may include image data sensors that may detect obstacles positioned in front of the ride vehicle 530. In situations where the ride vehicle 530 is determined to be immobilized, the control system 40 may send a signal or command to the valves 18 that fluidly couple the inflatable bumpers 532 to the fluid source. When the ride vehicle 530 is immobilized due to an obstruction or misalignment with a track, the inflatable bumpers 532 may be inflated such that the inflatable bumpers 532 push against a ground surface to lift the ride vehicle 530, move the ride vehicle 530 off of the obstruction, and the like.

In operation, the control system 40 may receive data from the sensors 22 related to the mobility of the ride vehicle 530. In response to receiving an indication that the ride vehicle 530 is immobilized (e.g., image of obstruction detected, loss of velocity detected, stalled position detected), the control system 40 may send the command to the valves 18 to inflate the inflatable bumpers 532. In addition, in some embodiments, the control system 40 may receive an indication or command via a user that specifies a particular inflatable bumper 532 to inflate. The control system 40 may, in turn, cause the valves 18 to fluidly connect the inflatable bumper 532 to the fluid source.

Figure 46:
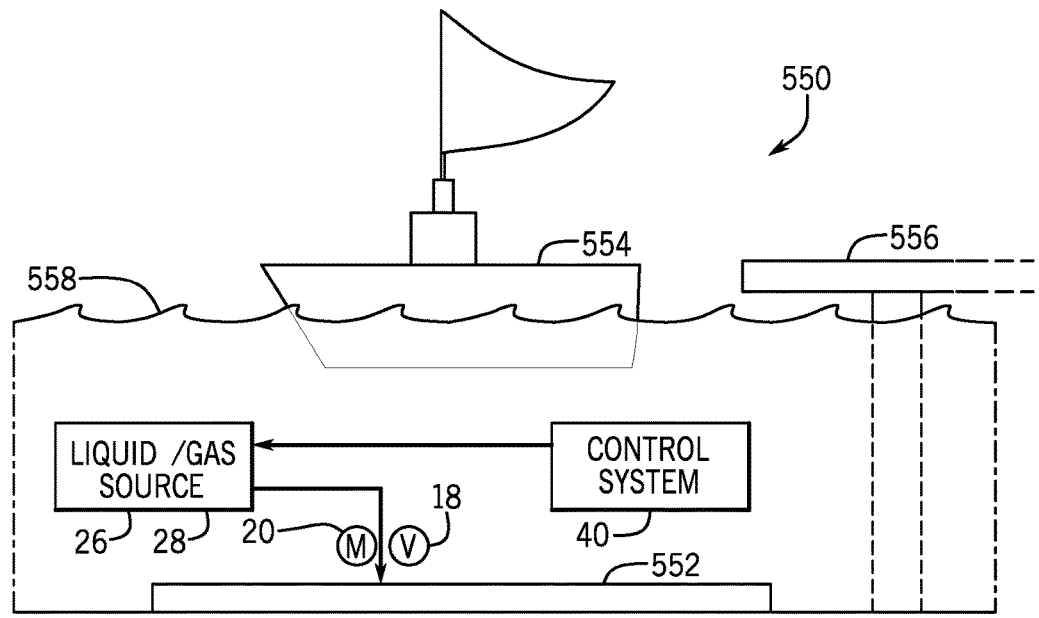
FIG. 46 illustrates a diagram of an aquatic amusement park ride system using the inflatable pneumatic system to overcome an obstacle, in accordance with embodiments described herein.

In addition to incorporating inflatable objects 12 in the ride vehicle 530, aquatic amusement park attractions may use inflatable objects 12 to halt a ride, provide an exit from the ride, and the like. By way of example, FIGS. 46 and 47 illustrate an aquatic amusement park ride 550 that may employ an inflatable platform 552 to stop a floating vehicle 554 or provide a pathway off of the floating vehicle 554.

In certain embodiments, the inflatable platform 552 may be disposed at the bottom of a pool or water basin in which the floating vehicle 554 may traverse the course of the aquatic amusement park ride 550. The inflatable platform 552 may also be positioned in other suitable areas such as under a dock 556, along a bank or edge of the water basin, and the like. In any case, if the control system 40 receives a command or signal to stop the aquatic amusement park ride 550 or provide an exit from the floating vehicle 554, the control system 40 may send a command to the valves 18 to fluidly couple the fluid source to the inflatable platform 552.

Figure 47:
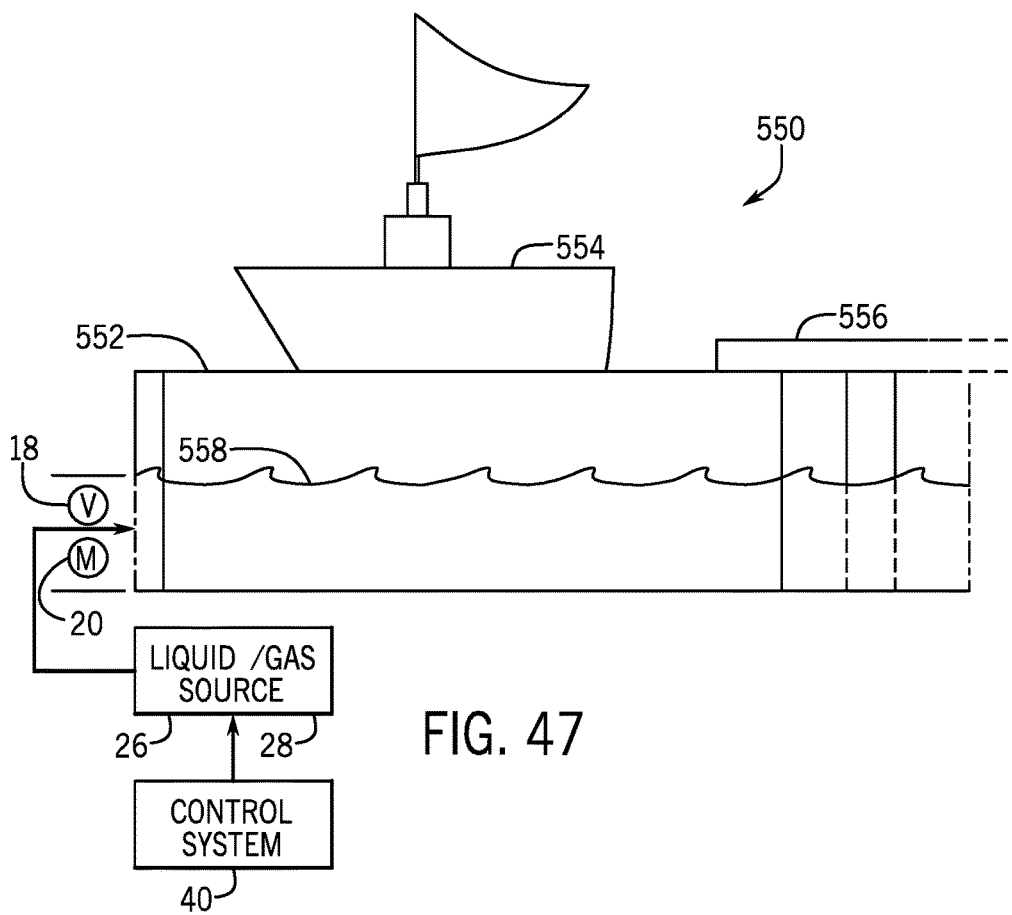
FIG. 47 illustrates a diagram of an aquatic amusement park ride system using the inflatable pneumatic system to overcome an obstacle, in accordance with embodiments described herein.

In its inflated configuration, as shown in FIG. 47, the inflatable platform 552 may rise above a water line 558, such that the floating vehicle 554 may no longer traverse or project along the water. Indeed, the floating vehicle 554 may be stopped from moving to allow a guest to exit the floating vehicle 554 and walk across the inflatable platform 552 to the dock 556. In some embodiments, the inflatable platform 552 may be positioned at various locations within the aquatic amusement park ride 550 to provide different locations where the floating vehicle 554 may stop and a guest may exit.

In addition to ground and aquatic environments, the IPS 10 may be used with unmanned aerial vehicle (UAV) (e.g., drones) to enhance a guest's experience at the amusement park. In one example, UAVs may include the inflatable object 12 that may form various shapes while the UAV is in flight. In one embodiment, the UAV may include a motor or pump dedicated to inflating the material. The flight or control of the UAV may counteract the force of the gas being pumped into the material to maintain its flight pattern. In another embodiment, the UAV may be tethered to an off-board gas supply that may provide gas for the inflatable material.

Figure 48:
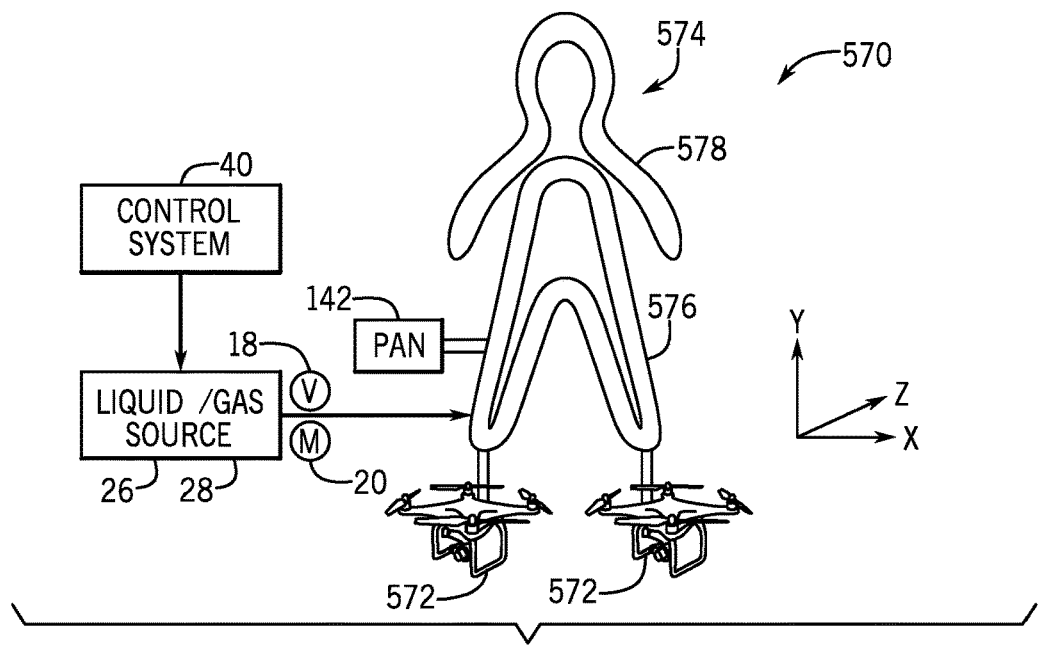
FIG. 48 illustrates a diagram of an unmanned aerial vehicle system using the inflatable pneumatic system, in accordance with embodiments described herein.

FIG. 48 illustrates an example of a pneumatic UAV system 570 that employs UAVs 572 to keep an inflatable figure 574 afloat. The UAVs 572 may operate based on preprogrammed flight patterns or may receive instructions with regard to its flight pattern from the control system 40 or the like. In certain embodiments, the inflatable figure 574 may be coupled to the fan 142 or the fluid source (e.g., liquid source 26/gas source 28), which may inflate tubes 576 and 578. Tubes 576 and 578 may form an outline of the inflatable figure 574. To assist the UAVs 572, the inflatable tubes 576 and 578 may be inflated with relatively low-density gas (e.g., floats in common atmosphere), such as helium.

The fan 142 may provide a fluid/gas for the inflatable figure 574 or may be used to assist the UAVs 572 to direct the motion or movement of the inflatable FIG. 574. In some embodiments, the fan 142 may include a controller or other suitable computing device that may communicatively couple with the control system 40. As such, the control system 40 may coordinate the circulation of fluids in the inflatable figure 574 using the fan 142 and the fluid source. That is, the control system 40 may use the UAVs 572 to control a motion of the inflatable figure 574 across one direction (e.g., z-axis) and inflate the inflatable tube 578 with helium to control the motion of the inflatable figure 574 in another direction (e.g., y-axis) or provide a lift force. To conserve a supply of the helium, the control system 40 may pump ambient air into the inflatable tube 576, such that the inflatable tube 576 may retain a certain shape.

In each of the embodiments described above, fluid (e.g., liquid or gas) may be circulated through the inflatable figure 574 or any other inflatable object 12 described herein to maintain a certain pressure within the inflatable assembly. In one embodiment, the circulated fluid may return to a pump or similar device to continuously reuse the fluid provided via a fluid source or the like.

Figure 49:
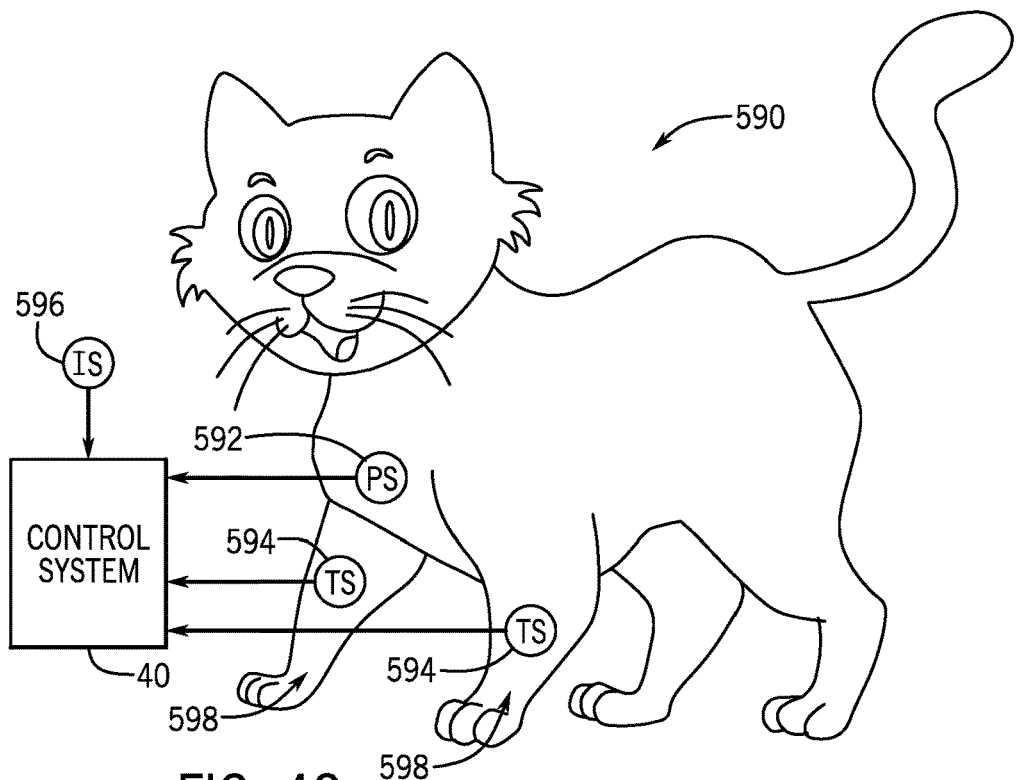
FIG. 49 illustrates a diagram of a number of sensors disposed in an inflatable object to coordinate operation of the inflatable pneumatic system, in accordance with embodiments described herein.

To coordinate the motion and shapes depicted by the inflatable figure 574, the control system 40 may use a variety of sensors 22 to determine the current shape, orientation, and/or position of the inflatable figure 574 or other suitable inflatable objects 12. For example, the shape of the inflatable figure 574 may be dynamically tracked by infrared or visible light sensors and the like. For example, FIG. 49 illustrates an example inflatable figure 590 that includes a pressure sensor 592, a tension sensor 594, and an image sensor 596 for providing data concerning the shape or arrangement of the inflatable figure 590. The pressure sensor 592 may detect a pressure in a particular area or region of the inflatable figure 590. In some embodiments, the pressure data received from the pressure sensor 592 may be associated with different shapes or configurations of the inflatable figure 590. For instance, a relatively low pressure measurement may indicate that the extremities 598 of the inflatable figure 590 may be retracted, while a relatively high pressure measurement may indicate that the extremities 598 of the inflatable figure 590 may be extended.

The tension sensors 594 may measure a tension of the inflatable material that makes up a portion of the inflatable figure 590. In some embodiments, the tension sensor 594 may be disposed on the inflatable material to measure an amount of tension or force that is on the inflatable material. A relatively high tension measurement may indicate that the portion (e.g., extremity 598) of the inflatable figure 590 may be extended outward, whereas a relatively low tension measurement may indicate that the portion (e.g., extremity 598) of the inflatable figure 590 may be retracted inward.

In addition to the tension sensors 594 and the pressure sensors 592, the control system 40 may receive image data from an image sensor 596 that may be positioned inside or outside the inflatable figure 590. The image data may provide an indication as to how the inflatable figure 590 may appear. In addition, the image sensor 596 may be positioned to monitor a particular portion of the inflatable figure 590. As such, the control system 40 may use image data from a number of image sensors 596 to ascertain the current shape of the inflatable figure 590. Using the data provided by the various sensors 22 and data indicative of a desired shape or motion for the inflatable figure 590, the control system 40 may coordinate the flow of fluids to the inflatable figure 590 or portions of the inflatable figure 590 to achieve the desired shape or motion.

Although FIG. 49 illustrates certain types of sensors 22, it should be noted that other suitable sensors 22 may be positioned in or around the inflatable figure 590 to provide the control system 40 with data regarding the shape of the inflatable figure 590. For instance, light sensors may be positioned inside the inflatable figure 590 to detect a distance between the light sensor and the inflatable material to determine a current position or shape of the inflatable figure 590.

In addition to controlling valves 20, fans 142, and the like, the control system 40 may, in some embodiments, control a projector system that may display images on an inflated object 12 to provide the object certain artistic details. That is, the projector system may actively produce images to map certain projections onto the inflatable object 12. In this way, the visual appearance of the inflatable object 12 can be altered through its physical morphology and using dynamically projected images. Generally, the shape of the inflated figure may be tracked in real time, visually, as it is being actuated, as described above. Projection mapping techniques may then be used to change the visual appearance of the inflated figure. Because of the nature of inflatable objects, present embodiments may employ the sensors described above with respect to FIG. 49 to provide information regarding the shape of the inflated object, which may be used to determine what images and what size of images should be projected onto the inflatable objects 12.

Figure 50:
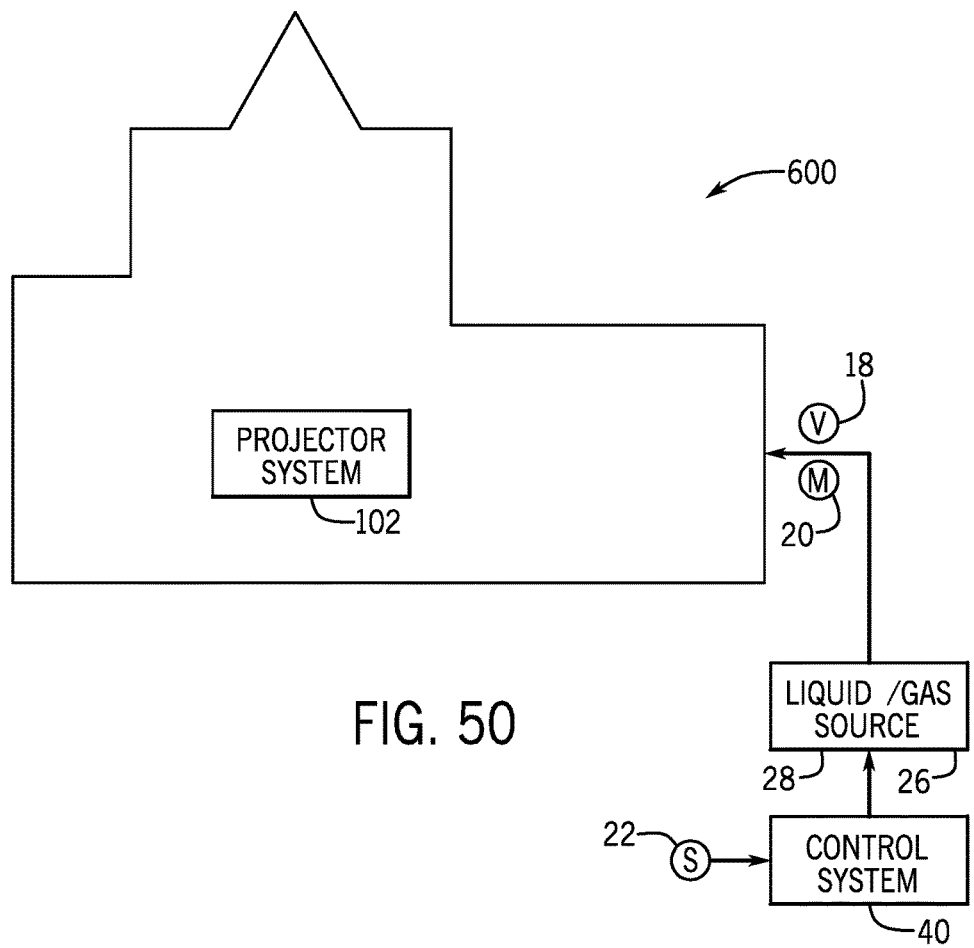
FIG. 50 illustrates a diagram of projector system disposed in an inflatable controlled by the inflatable pneumatic system, in accordance with embodiments described herein.

By way of example, FIG. 50 illustrates an inflatable architectural element 600 including a projector system 602 that may project images via light rays that depict an image. The inflatable architectural element 600 may include a number of inflatable members, such that different combinations of inflated configurations of the inflatable members create different shapes of the inflatable architectural element 600. The projector system 602 may include a projecting light source that projects or displays images onto a surface. The projector system 602 may be positioned inside or outside the inflatable architectural element 600. In the example provided in FIG. 50, the inflatable architectural element 600 may form a certain shape in its inflated configuration. However, without any images, patterns, or color on the inflatable architectural element 600, the inflatable architectural element 600 may not resemble any discernable figure or structure to a guest of an amusement park. In other embodiments, the inflatable architectural element 600 may depict a distinctly different discernable figure or structure than the projected image.

Figure 51:
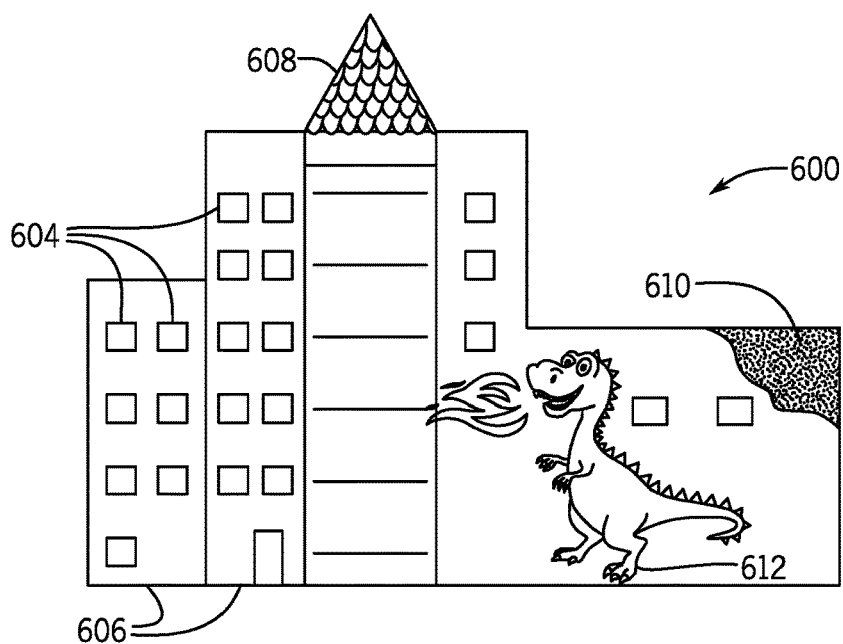
FIG. 51 illustrates a diagram of projector system disposed in an inflatable controlled by the inflatable pneumatic system, in accordance with embodiments described herein.

In certain embodiments, after the shape and positions of the inflatable architectural element 600 are detected by the sensors 22, the projector system 602 may project an image that provides details for the inflatable architectural element 600. For instance, the projector system 602 may project images of windows 604, buildings 606, a tower 608, and other architectural features, as depicted in FIG. 51. In addition, the projector system 602 may depict or present damaged portions 610 of the inflatable architectural element 600. The projections may change as the inflatable architectural element 600 is inflated and deflated (e.g., a building may turn to rubble as deflated).

In addition, animated objects and figures may be presented on the inflatable architectural element 600 to cause a guest to view changes occurring to the inflatable architectural element 600. For example, a dragon FIG. 612 may be projected onto the inflatable architectural element 600 via the projector system 602 to enhance the guest's experience with the inflatable architectural element 600.

In some embodiments, the images projected onto the inflatable architectural element 600 may be determined based on the shape and position of the inflatable architectural element 600. As such, the control system 40 may control the flow of fluid into various inflatable objects 12 that make up the inflatable architectural element 600 to cause the inflatable architectural element 600 to change shapes or positions. As the inflatable architectural element 600 morphs, the control system 40 and the sensors 22 may provide data to the projector system 602, which may include similar components as described above with respect to the control system 40 of FIG. 2. Based on the received data, the projector system 602 may adjust the images projected onto the inflatable architectural element 600 to match the current shape and position of the inflatable architectural element 600.

Although the foregoing description of the projector system 602 is described with the inflatable architectural element 600, it should be noted that the projector system 602 described herein may be used with any suitable inflatable object 12. That is, the inflatable object 12 may include any of the figures described herein and may be applied to large-scale objects and smaller-scale objects.

It should be noted that each of the embodiments described herein may be used in certain exhibits at an amusement park or the like to perform live-action shows or presentations.

However, by using the IPS 10 described herein, inflatable objects 12 may become accessible to the audience given the nature of using fluid flow to control the movements of the objects. As a result, the IPS 10 may enable more amusement attractions and exhibits to be made interactive, such that the exhibits change shapes or move in certain directions in response to the control system 40 detecting a guest's position, gesture, or motion.

Indeed, using fluids to control motions in an exhibit provide for more life-like motions, as compared to mechanical devices moving in linear motions. Moreover, the material (e.g., a vinyl material, a rubber material) may expand and retract more naturally and thus may convey a more realistic motion of the associated object. As a result, the guest's experience is enhanced in an amusement park that provides more interactive exhibits that are safe to touch and respond in more natural and realistic motions.

While only certain features of the present disclosure have been illustrated and described herein, many modifications and changes will occur to those skilled in the art. It is, therefore, to be understood that the appended claims are intended to cover all such modifications and changes as fall within the true spirit of the embodiments described herein.

The invention claimed is:

1. A system, comprising:
  a virtual reality system configured to present one or more virtual objects via an electronic display;
  one or more inflatable objects that correspond to the one or more virtual objects, wherein one or more shapes of the one or more inflatable objects matches one or more shapes of the one or more virtual objects; and
  a processor configured to cause at least one of the one or more inflatable objects to inflate based on feedback from the virtual reality system.

2. The system of claim 1, wherein the virtual reality system is configured to receive data from one or more sensors, wherein the data comprises a characteristic of a first inflatable object of the one or more inflatable objects, and wherein the virtual reality system is configured to adjust a presentation of a first virtual object of the one or more virtual objects based on the characteristic.

3. The system of claim 1, wherein the processor is configured to cause the at least one of the one or more inflatable objects to inflate when a position of a user of the virtual reality system is detected within a threshold distance of the at least one of the one or more inflatable objects.

4. The system of claim 1, wherein the virtual reality system is configured to receive data from one or more sensors, wherein the data comprises a motion associated with a first inflatable object of the one or more inflatable objects, and wherein the virtual reality system is configured to adjust a presentation of a first virtual object of the one or more virtual objects based on the motion.

5. The system of claim 1, wherein the one or more inflatable objects comprise one or more inflatable walls of an inflatable maze structure.

6. The system of claim 5, wherein the one or more inflatable walls is configured to block access to one or more portions of an amusement park.

7. The system of claim 1, wherein the processor is configured to cause the at least one of the one or more inflatable objects to inflate based on a signal received from a sensor.

* * * * *